United States Patent
Nagamine et al.

(10) Patent No.: US 10,629,804 B2
(45) Date of Patent: Apr. 21, 2020

(54) METHOD OF MANUFACTURING MAGNETORESISTIVE DEVICE

(75) Inventors: Yoshinori Nagamine, Kawasaki (JP); Koji Tsunekawa, Kawasaki (JP); David Djulianto Djayaprawira, Kawasaki (JP); Hiroki Maehara, Kawasaki (JP)

(73) Assignee: Canon Anelva Corporation, Kawasaki-shi, Kanagawa (JP)

( * ) Notice: Subject to any disclaimer, the term of this patent is extended or adjusted under 35 U.S.C. 154(b) by 789 days.

(21) Appl. No.: 12/224,646

(22) PCT Filed: Feb. 26, 2007

(86) PCT No.: PCT/JP2007/053487
§ 371 (c)(1),
(2), (4) Date: Dec. 3, 2008

(87) PCT Pub. No.: WO2007/105472
PCT Pub. Date: Sep. 20, 2007

(65) Prior Publication Data
US 2009/0148595 A1    Jun. 11, 2009

(30) Foreign Application Priority Data

Mar. 3, 2006   (JP) ................................ 2006-058748
Feb. 15, 2007  (JP) ................................ 2007-034686

(51) Int. Cl.
*G11B 5/39*   (2006.01)
*H01L 43/08*  (2006.01)
(Continued)

(52) U.S. Cl.
CPC ............ *H01L 43/08* (2013.01); *C23C 14/081* (2013.01); *C23C 14/16* (2013.01); *C23C 14/568* (2013.01);
(Continued)

(58) Field of Classification Search
CPC ... G11B 5/39; G11B 5/59688; G11B 5/24027; G11B 5/33; G11B 5/03; H01L 41/12
(Continued)

(56) References Cited

U.S. PATENT DOCUMENTS 3,616,403 A    10/1971   Collins et al.
4,782,477 A *  11/1988   Ichihara .................. G11B 7/24
                                                            346/135.1
(Continued)

FOREIGN PATENT DOCUMENTS

CN    1308316 A     8/2001
EP    0 818 556 A1  1/1998
(Continued)

OTHER PUBLICATIONS

C. Y. Chou et al, "Microstructure and magnetoresistance of MgO thin film with CoFeB and CoFeC under layers", Journal of Magnetism and Magnetic materials 310(2007) 2245-224.*
(Continued)

*Primary Examiner* — Tabassom Tadayyon Eslami
(74) *Attorney, Agent, or Firm* — Buchanan Ingersoll & Rooney PC

(57) ABSTRACT

A magnetoresistance device has an MgO (magnesium oxide) layer provided between a first ferromagnetic layer and a second ferromagnetic layer. The device is manufactured by forming a film of the MgO layer in a film forming chamber. A substance whose getter effect with respect to an oxidizing gas is large is adhered to surfaces of components provided in the chamber for forming the MgO layer. The substance having a large getter effect is a substance whose value of oxygen gas adsorption energy is 145 kcal/mol or higher. Ta (tantalum), in particular, is preferable as a substance which constitutes the magnetoresistance device.

10 Claims, 16 Drawing Sheets

(51) Int. Cl.
  *H01L 43/12* (2006.01)
  *H01J 37/34* (2006.01)
  *C23C 14/56* (2006.01)
  *H01J 37/32* (2006.01)
  *C23C 14/16* (2006.01)
  *C23C 14/08* (2006.01)

(52) U.S. Cl.
  CPC .. *H01J 37/32458* (2013.01); *H01J 37/32633* (2013.01); *H01J 37/34* (2013.01); *H01J 37/3429* (2013.01); *H01J 37/3447* (2013.01); *H01L 43/12* (2013.01)

(58) Field of Classification Search
  USPC .......... 427/255.29, 127, 128, 129, 130, 131, 427/132; 428/811.1, 58; 360/324.2, 328; 118/719, 726
  See application file for complete search history.

(56) References Cited

U.S. PATENT DOCUMENTS

| | | | |
|---|---|---|---|
| 5,367,285 A * | 11/1994 | Swinehart et al. | 338/308 |
| 5,449,444 A * | 9/1995 | Yoshikawa | C23C 14/34 118/724 |
| 5,707,498 A * | 1/1998 | Ngan | 204/192.12 |
| 5,986,858 A | 11/1999 | Sato et al. | |
| 6,551,471 B1 | 4/2003 | Yamaguchi et al. | |
| 6,674,615 B2 | 1/2004 | Hayashi | |
| 6,923,860 B1 * | 8/2005 | Karr et al. | 117/89 |
| 2002/0009616 A1 | 1/2002 | Kamiguchi et al. | |
| 2002/0064595 A1 * | 5/2002 | Nomura et al. | 427/131 |
| 2003/0022487 A1 | 1/2003 | Yoon et al. | |
| 2003/0143434 A1 * | 7/2003 | Koujima | G11B 5/653 428/831 |
| 2004/0119916 A1 | 6/2004 | Kim et al. | |
| 2004/0244684 A1 | 12/2004 | Tsunoda et al. | |
| 2004/0262642 A1 | 12/2004 | Shimamoto et al. | |
| 2006/0003185 A1 | 1/2006 | Parkin | |
| 2006/0042929 A1 | 3/2006 | Mauri | |
| 2006/0042930 A1 * | 3/2006 | Mauri | B82Y 25/00 204/192.15 |
| 2006/0056115 A1 * | 3/2006 | Djayaprawira et al. | 360/324.2 |
| 2006/0221510 A1 * | 10/2006 | Parkin | B82Y 10/00 360/324.2 |
| 2007/0171694 A1 * | 7/2007 | Huai et al. | 365/145 |
| 2008/0055793 A1 | 3/2008 | Djayaprawira et al. | |
| 2008/0124454 A1 | 5/2008 | Djayaprawira et al. | |
| 2008/0180862 A1 | 7/2008 | Djayaprawira et al. | |
| 2011/0094875 A1 | 4/2011 | Djayaprawira et al. | |

FOREIGN PATENT DOCUMENTS

| | | | |
|---|---|---|---|
| EP | 1 630 247 A1 | | 3/2006 |
| JP | 02-050959 A | | 2/1990 |
| JP | 03-014227 A | | 1/1991 |
| JP | 03-097855 A | | 4/1991 |
| JP | 04-099271 A | | 3/1992 |
| JP | 404132280 | * | 5/1992 |
| JP | 40202768 | * | 7/1992 |
| JP | 11-117064 A | | 4/1999 |
| JP | 11-152564 A | | 6/1999 |
| JP | 2001-107229 A | | 4/2001 |
| JP | 2001-181820 A | | 7/2001 |
| JP | 2001-295024 A | | 10/2001 |
| JP | 2004-153258 A | | 5/2004 |
| JP | 2004-158714 A | | 6/2004 |
| JP | 2004-235223 A | | 8/2004 |
| JP | 2004-259280 A | | 9/2004 |
| JP | 2005-298894 A | | 10/2005 |
| JP | 2005-333106 A | | 12/2005 |
| JP | 2006-080116 A | | 3/2006 |
| KR | 100307074 | * | 8/2001 |
| KR | 2006-0051048 A | | 5/2006 |

OTHER PUBLICATIONS

Journal if Magnetism and Magnetic Materials 310(2007)2245-2247.*
Y. Nagamineh et al, Applied Physics letters, 89, 162507(2006).*
Y. S. Choi et al, Applied Physics letters, 90, 012505(2007).*
A Japanese Office Action (and English translation thereof) dated Aug. 8, 2008, issued in a counterpart Japanese Application.
Extended European Search Report dated Feb. 16, 2009 (10 pages), issued in counterpart European Application Serial No. 08168830.1.
Matsumoto et al., "Tunneling spectra of sputter-deposited CoFeB/MgO/CoFeB magnetic tunnel junctions showing giant tunneling magnetoresitance effect", Solid State Communications, Oxford, vol. 136, No. 11-12, Dec. 1, 2005, pp. 611-615.
Parkin et al., "Giant tunneling magnetoresistance at room temperature with MgO (100) tunnel barriers", Nature Materials, Nature Publishing Group, London, vol. 3, No. 12, Dec. 1, 2004, pp. 862-867.
Ghekiere et al., "Influence of the deposition parameters on the biaxial alignment of MgO grown by unbalanced magnetron sputtering", Journal of Crystal Growth, Elsevier, Amsterdam, vol. 271, No. 3-4, Nov. 15, 2004, pp. 462-468.
Chinese Office Action dated Jan. 22, 2010 (and English translation thereof) in counterpart Chinese Application No. 200780007233.2.
Chinese Office Action dated Nov. 9, 2010 (and English translation thereof) in counterpart Chinese Application No. 200780007233.2.
Chinese Office Action dated Jun. 11, 2010 (and English translation thereof) in counterpart Chinese Application No. 200910146788.6.
Korean Office Action dated Dec. 22, 2010 in counterpart Korean Application No. 10-2008-7024222.
European Office Action dated Jul. 15, 2010 (in English) in counterpart European Application No. 08 168 830.1.
P. Vuoristo et al.: "RBS analysis of sputter-deposited MgO films"; Vacuum, vol. 42, No. 15, (Jan. 1, 1991); pp. 1001-1004.
Japanese Office Action dated Mar. 11, 2011 in counterpart Japanese Application No. 2008-260231.
D. Djayaprawire et al; 230% Room-Temperature Magnetoresistance in CoFeB/MgO/CoFeB; Applied Physics Letters 86; 2005.
Extended European Search Report (EESR) dated Oct. 2, 2012 (in English) issued in counterpart European Application No. 07714919.3.
Tsunekawa K. et al.: "Giant tunneling magnetoresistance effect in low-resistance CoFeB/MgO(001)/CoFeB magnetic tunnel junctions for read-head applications": Applied Physics Letters: AIP: American Institute of Physics: vol. 87, No. 7: Aug. 8, 2005: pp. 072503/1-072503/3; XP 012077470; ISSN: 0003-6951. (In English).
Nagamine Y. et al.: "Ultralow resistance-area product of 0.4 Ohm(um)2 and high magnetoresistance above 50% in CoFeB/MgO/CoFeB magnetic tunnel junctions": Applied Physics Letters: AIP: American Institute of Physics: vol. 89, No. 16: Oct. 17, 2006: pp. 162507-1-162507-3; XP 012086435; ISSN: 0003-6951. (In English).
Chinese Office Action dated Dec. 7, 2011 (and English translation thereof) in counterpart Chinese Application No. 200780007233.2.
European Office Action dated Feb. 13, 2012 (in English) in counterpart European Application No. 08 168 830.1.
Taiwanese Office Action dated Jun. 14, 2012—and English translation thereof, issued in counterpart Taiwanese Application No. 096107307.
European Communication dated May 15, 2013 (in English) issued in counterpart European Application No. 07 714 919.3.
Chinese Office Action dated Feb. 8, 2014 (and English translation thereof) in counterpart Chinese Application No. 201210345416.8.

* cited by examiner

METHOD OF MANUFACTURING MAGNETORESISTIVE DEVICE

This application is a U.S. National Phase Application under 35 USC 371 of International Application PCT/JP2007/053487 filed Feb. 26, 2007.

TECHNICAL FIELD

The present invention relates to method of manufacturing a magnetoresistance effect element used for an MRAM (magnetic random access memory) or a magnetic head sensor and an apparatus for manufacturing the same.

BACKGROUND ART

A magnetoresistance effect element is used for an MRAM (magnetic random access memory) or a magnetic head sensor. The magnetoresistance effect element having a fundamental structure including a first ferromagnetic layer/an insulator layer/a second ferromagnetic layer is, utilizing the property such that the electric resistance is low when the direction of magnetization of the first ferromagnetic layer and the second ferromagnetic layer extend in parallel and is high when in non-parallel, adapted in such a manner that the direction of magnetization of one of the ferromagnetic layers is fixed and the direction of magnetization of the other one of the ferromagnetic layers is variable according to the external magnetic field to detect the direction of external magnetic field as a change in electric resistance. In order to obtain a high detection sensitiveness, high MR ratio (magnetoresistance ratio), which is an index of variation in electric resistance value between the cases in which the direction of magnetization is parallel and non-parallel is required. The inventor proposed a magnetoresistance effect element using magnesium oxide although referred to as MgO hereinafter, it does not mean that stoichiometry is 1:1) is formed into a film by spattering as an insulator layer of the magnetoresistance effect element as a configuration in which a high MR ratio is obtained (for example, see Non-Patent Document 1 and Patent Document 1).

[Non-Patent Document 1] APPLIED PHYSICS LETTERS 86, 092502 (2005)

[Patent Document 1] Patent Application 2004-259280

DISCLOSURE OF INVENTION

Problem to be Solved by the Invention

In order to achieve a higher density of MRAMs or a higher resolution of magnetic heads, it is required to further reduce the size of the element. When the size of the element is reduced, it is necessary to reduce the electric resistance value per 1 $\mu m^2$ (hereinafter, referred to as RA) sufficiently when the direction of magnetization is parallel for a desirable operation. The RA of the magnetoresistance effect element is reduced by reducing the thickness of the MgO film of an insulator layer. However, when the thickness of the MgO film is reduced, the MR ratio is significantly lowered and, consequently, there arises a problem such that both the low RA and the high MR ratio cannot be achieved simultaneously.

It is an object of the present invention to provide a method of manufacturing a magnetoresistance effect element which achieves a high MR ratio even when the value of RA is low, and an apparatus for manufacturing the same.

A method of manufacturing a magnetoresistance effect element according to the present invention is a method of manufacturing a magnetoresistance effect element having an MgO layer between a first ferromagnetic layer and a second ferromagnetic layer including a step of forming the first ferromagnetic layer, a step of forming the MgO layer, and a step of forming the second ferromagnetic layer in this order, characterized in that the step of forming the MgO layer is carried out in a film forming chamber including a component having a substance whose getter effect with respect to oxidizing gas is larger than MgO adhered to the surface thereof.

The method of manufacturing a magnetoresistance effect element according to the present invention is characterized in that the film forming chamber for forming the MgO layer includes at least one film forming means for a substance whose getter effect with respect to the oxidizing gas is larger than MgO, and adhesion of the substance whose getter effect with respect to the oxidizing gas is larger than MgO to the component is carried out by one or a plurality of the film forming means.

The method of manufacturing a magnetoresistance effect element according to the present invention is characterized in that the substance whose getter effect with respect to the oxidizing gas is larger than MgO includes at least one element which is included in the substance which constitutes the magnetoresistance effect element.

The method of manufacturing a magnetoresistance effect element according to the present invention is a method of manufacturing a magnetoresistance effect element having an MgO layer between a first ferromagnetic layer and a second ferromagnetic layer including a step of forming the first ferromagnetic layer, a step of forming the MgO layer, and a step of forming the second ferromagnetic layer in this order, characterized in that the step of forming the MgO layer is carried out in a film forming chamber including a component having a substance whose getter effect with respect to the oxidizing gas is larger than the substance which constitutes the first ferromagnetic layer.

The method of manufacturing a magnetoresistance effect element according to the present invention is characterized in that the film forming chamber for forming the MgO layer includes at least one film forming means for a substance whose getter effect with respect to the oxidizing gas is larger than the substance which constitutes the first ferromagnetic layer, and adhesion of the substance whose getter effect with respect to the oxidizing gas is larger than the substance which constitutes the first ferromagnetic layer to the component is carried out by the film forming means.

The method of manufacturing a magnetoresistance effect element according to the present invention is characterized in that the substance whose getter effect with respect to the oxidizing gas is larger than the substance which constitutes the first ferromagnetic layer includes at least one element which is included in the substance which constitutes the magnetoresistance effect element.

A method of manufacturing a magnetoresistance effect element according to the present invention is a method of manufacturing a magnetoresistance effect element having an MgO layer between a first ferromagnetic layer and a second ferromagnetic layer including a step of forming the first ferromagnetic layer, a step of forming the MgO layer, and a step of forming the second ferromagnetic layer in this order, characterized in that the step of forming the MgO layer is carried out in a film forming chamber including a component having a substance whose getter effect with respect to oxidizing gas is maximum from among the substances which constitute the magnetoresistance effect element adhered to the surface thereof.

A method of manufacturing a magnetoresistance effect element according to the present invention is a method of manufacturing a magnetoresistance effect element having an MgO layer between a first ferromagnetic layer and a second ferromagnetic layer including a step of forming the first ferromagnetic layer, a step of forming the MgO layer, and a step of forming the second ferromagnetic layer in this order, characterized in that the step of forming the MgO layer is carried out in a film forming chamber including a component having a substance whose value of oxygen gas adsorption energy is 145 kcal/mol or higher adhered to the surface thereof.

A method of manufacturing a magnetoresistance effect element according to the present invention is a method of manufacturing a magnetoresistance effect element having an MgO layer between a first ferromagnetic layer and a second ferromagnetic layer including a step of forming the first ferromagnetic layer, a step of forming the MgO layer, and a step of forming the second ferromagnetic layer in this order, characterized in that the step of forming the MgO layer is carried out in a film forming chamber having a component including metal or a semiconductor including at least one of Ta (tantalum), Ti (titanium), Mg (magnesium), Zr (zirconium), Nb (niobium), Mo (molybdenum), W (tungsten), Cr (chrome), Mn (manganese), Hf (hafnium), V (vanadium), B (boron), Si (silicon), Al (aluminum) and Ge (germanium) adhered to the surface thereof.

The method of manufacturing a magnetoresistance effect element according to the present invention is characterized in that the step of forming the MgO layer forms the MgO layer by a spattering method.

A method of manufacturing a magnetoresistance effect element according to the present invention is a method of manufacturing a magnetoresistance effect element using an apparatus having a plurality of film forming chambers including a first film forming chamber connected to a carrier chamber via a valve being capable of transferring substrates through the plurality of film forming chambers without impairing vacuum, including a first step for adhering a substance whose getter effect with respect to the oxidizing gas is larger than MgO to the surface of a component in the first film forming chamber, a third step carried out after the first step for forming an MgO layer on the substrate in the first film forming chamber, and a second step for carrying out from a next step of the first step to a step before the third step in the film forming chamber other than the first film forming chamber, characterized in that the first step, the second step and the third step are carried out continuously in this order.

A method of manufacturing a magnetoresistance effect element according to the present invention is a method of manufacturing a magnetoresistance effect element using an apparatus having a plurality of film forming chambers including a first film forming chamber connected to a carrier chamber via a valve being capable of transferring substrates through the plurality of film forming chambers without impairing vacuum, including a first step of adhering a substance whose value of oxygen gas adsorption energy is 145 kcal/mol or higher to the surfaces of components in the first film forming chamber, a third step carried out after the first step for forming an MgO layer on the substrate in the first film forming chamber, and a second step for carrying out from a next step of the first step to a step before the third step in the film chamber other than the first film forming chamber, characterized in that the first step, the second step and the third step are carried out continuously in this order.

A method of manufacturing a magnetoresistance effect element according to the present invention is a method of manufacturing a magnetoresistance effect element using an apparatus having a plurality of film forming chambers including a first film forming chamber connected to a carrier chamber via a valve being capable of transferring substrates through the plurality of film forming chambers without impairing vacuum, including a first step for adhering metal or a semiconductor including at least one of Ta, Ti, Mg, Zr, Nb, Mo, W, Cr, Mn, Hf, V, B, Si, Al and Ge to the surface of a component in the first film forming chamber, a third step carried out after the first step for forming an MgO layer on the substrate in the first film forming chamber, and a second step for carrying out from a next step of the first step to a step before the third step in the film forming chamber other than the first film forming chamber, characterized in that the first step, the second step and the third step are carried out continuously in this order.

The method of manufacturing a magnetoresistance effect element according to the present invention is characterized in that the first step adheres the substance whose getter effect with respect to the oxidizing gas is large to the surface of the component in the first film forming chamber and, simultaneously, forms a film on the substrate.

The method of manufacturing a magnetoresistance effect element according to the present invention is characterized in that the first step is carried out in parallel with the step of forming a film on the substrate in the film forming chamber other than the first film forming chamber.

The method of manufacturing a magnetoresistance effect element according to the present invention is characterized in that the third step forms the MgO layer by a spattering method.

A method of manufacturing a magnetoresistance effect element according to the present invention is a method of manufacturing a magnetoresistance effect element using an apparatus having a plurality of film forming chambers including a first film forming chamber connected to a carrier chamber via a valve being capable of transferring substrates through the plurality of film forming chambers without impairing vacuum, including a step of transferring the substrate to the first film forming chamber, spattering Mg in the first film forming chamber and forming an Mg layer on the substrate and, simultaneously, adhering Mg to the surfaces of components in the first film forming chamber, and a subsequent step of forming an MgO layer in the first film forming chamber.

An apparatus for manufacturing a magnetoresistance effect element according to the present invention is characterized in that a film forming chamber for forming an MgO layer includes means for adhering a substance whose getter effect with respect to oxidizing gas is larger than MgO to the surface of a component in the film forming chamber provided therein.

An apparatus of manufacturing a magnetoresistance effect element according to the present invention is an apparatus of manufacturing a magnetoresistance effect element having an MgO layer between a first ferromagnetic layer and a second ferromagnetic layer including means for adhering a substance whose getter effect with respect to oxidizing gas is larger than the substance which constitutes a first ferromagnetic layer to the surfaces of components in the film forming chamber in the film forming chamber for forming the MgO layer.

The apparatus of manufacturing a magnetoresistance effect element according to the present invention is characterized in that the substance whose getter effect with respect to the oxidizing gas is large is a substance having the largest getter effect with respect to the oxidizing gas in the substances which constitute the magnetoresistance effect element.

An apparatus of manufacturing a magnetoresistance effect element according to the present invention includes means for adhering a substance whose value of oxygen gas adsorption energy is 145 kcal/mol or higher to the surfaces of components in the film forming chamber in the film forming chamber for forming an MgO layer.

An apparatus of manufacturing a magnetoresistance effect element according to the present invention includes means for adhering metal or a semiconductor including at least one of Ta, Ti, Mg, Zr, Nb, Mo, W, Cr, Mn, Hf, V, B, Si, Al and Ge to the surface of the component in the film forming chamber in the film forming chamber for forming an MgO layer.

The apparatus of manufacturing a magnetoresistance effect element in the present invention has a plurality of film forming chambers including the film forming chamber connected to a carrier chamber for forming the MgO layer via a valve being capable of transferring substrates through the plurality of film forming chambers without impairing vacuum.

The apparatus of manufacturing a magnetoresistance effect element according to the present invention is characterized in that a target of MgO is provided in the film forming chamber for forming the MgO layer, and an electric power supply unit for supplying an electric power to the target is provided.

A method of manufacturing a magnetoresistance effect element according to the present invention is a method of manufacturing a magnetoresistance effect element having an MgO layer between a first ferromagnetic layer and a second ferromagnetic layer, including a step of forming the first ferromagnetic layer, a step of forming the MgO layer, and a step of forming the second ferromagnetic layer, characterized in that the step of forming the MgO layer is carried out in a state in which a substrate is at a floating potential.

A method of manufacturing a magnetoresistance effect element according to the present invention is a method of manufacturing a magnetoresistance effect element having a substrate, a first ferromagnetic layer, a second ferromagnetic layer and an MgO layer formed between the first ferromagnetic layer and the second ferromagnetic layer, including a step of forming the first ferromagnetic layer on the substrate, a step of forming the MgO layer, and a step of forming the second ferromagnetic layer, characterized in that the step of forming the MgO layer is carried out by placing the substrate on a substrate placing bed having a portion which comes into contact with the substrate formed of an insulating substance.

The method of manufacturing a magnetoresistance effect element according to the present invention is characterized in that the substrate is placed on the substrate placing bed on which the insulating substance is sprayed.

The method of manufacturing a magnetoresistance effect element according to the present invention is characterized in that the substrate is placed on the substrate placing bed formed of the insulating substance.

The method of manufacturing a magnetoresistance effect element according to the present invention is characterized in that the step of forming the MgO layer is carried out in a state in which a mask is arranged on a peripheral portion of the substrate so as to be apart from the substrate.

A method of manufacturing a magnetoresistance effect element according to the present invention is a method of manufacturing a magnetoresistance effect element having an MgO layer between a first ferromagnetic layer and a second ferromagnetic layer, including a step of forming the first ferromagnetic layer, a step of forming the MgO layer and a step of forming the second ferromagnetic layer, characterized in that the step of forming the MgO layer is carried out in a state in which the substrate and a substrate holding holder for holding the substrate are electrically insulated.

The method of manufacturing a magnetoresistance effect element according to the present invention is characterized in that the step of forming the MgO layer is carried out in a state in which a mask electrically insulated from the substrate is arranged in the peripheral portion of the substrate.

An apparatus for manufacturing a magnetoresistance effect element according to the present invention is an apparatus of manufacturing a magnetoresistance effect element having an MgO layer between a first ferromagnetic layer and a second ferromagnetic layer including means for bringing a substrate into a state of being at a floating potential in a film forming chamber for forming the MgO layer.

An apparatus of manufacturing a magnetoresistance effect element according to the present invention is an apparatus of manufacturing a magnetoresistance effect element having an MgO layer between a first ferromagnetic layer and a second ferromagnetic layer including means for electrically insulating a substrate and a substrate holder for holding the substrate in a film forming chamber for forming the MgO layer.

Advantages of the Invention

In the method of manufacturing a magnetoresistance effect element and the apparatus for manufacturing the same according to the present invention, the MgO layer is formed on the substrate in a state in which the substance whose getter effect with respect to oxygen or water or the like (hereinafter, referred to as oxidizing gas) is large is adhered to the surface of the component in the film forming chamber for forming the MgO layer. Accordingly, even when the thickness of the MgO film is small, the magnetoresistance effect element with a high MR ratio is obtained and, consequently, the magnetoresistance effect element at a high MR ratio is obtained with a low value of RA. It is considered that the oxidizing gas such as oxygen or water discharged from the film forming means during formation of the MgO layer is taken by the substance whose getter effect with respect to the oxidizing gas such as oxygen or water is large and hence is removed, so that the MgO layer is formed in a state in which not much residual gas exists in the film forming chamber.

By selecting the substance whose getter effect with respect to the oxidizing gas such as oxygen or water is large, which is to be adhered to the interior of an MgO film forming chamber, from among the substances which constitutes the magnetoresistance effect element as a target, means for adhering the substance whose getter effect with respect to the oxidizing gas such as oxygen or water is large to the surface of the component in the MgO film forming chamber and means for forming a thin layer may be commonly used, so that it is not necessary to provide specific means for adhering the substance whose getter effect with respect to the oxidizing gas such as oxygen or water is large. Since the step of adhering the substance whose getter effect with respect to the oxidizing gas such as oxygen or water is large to the surface of the component in the MgO film forming chamber and a step of forming the thin layer are achieved simultaneously, the steps may be reduced.

After having studied in various manner, it was found that the step of forming the MgO insulator layer is important from among the thin layers which constitute the magnetoresistance effect element, and the property of the magnetoresistance effect element is significantly affected by the type of the substance adhered to the surface of the component in the film forming chamber for forming the MgO insulator layer.

Also, after having studied, it was found that when the substance adhered to the surface of the component in the film forming chamber is the substance whose getter effect with respect to the oxidizing gas such as oxygen or water is large, the magnetoresistance effect element at a high MR ratio is obtained even with the low value of RA. The present invention is achieved on the basis of the knowledge as described above.

In the method of manufacturing a magnetoresistance effect element and the apparatus for manufacturing the same, the MgO layer is formed in the state in which the substrate is at the floating potential, or in the state in which the substrate and the substrate holder for holding the substrate are electrically insulated, so that the magnetoresistance effect element at the high MR ratio is obtained even though the thickness of the MgO film is small and, consequently, the magnetoresistance effect element at the high MR ratio was obtained even with the low value of RA.

BRIEF DESCRIPTION OF THE DRAWINGS

FIG. 15A is a drawing showing a state, and in which a mask and the substrate is in contact with each other. FIG. 15B is a drawing showing a state in which the mask and the substrate are apart from each other.

Figure 1:
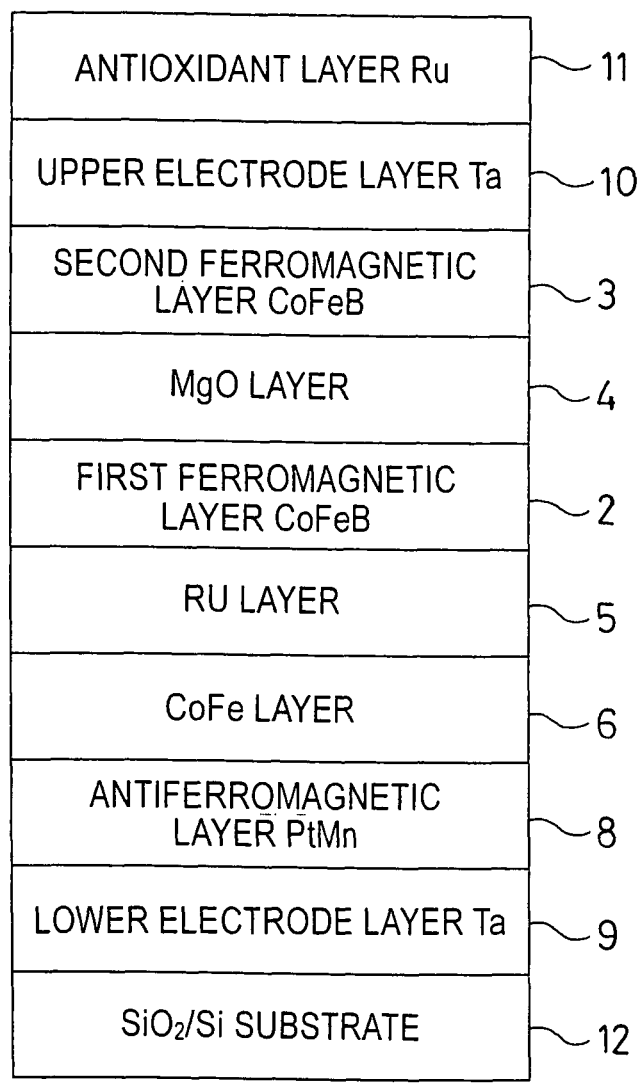
FIG. 1 is a drawing showing an example of a thin film configuration of a magnetoresistance effect element having an MgO insulator layer, which is manufactured in a first embodiment of the present invention.

REFERENCE NUMERALS 2 first ferromagnetic layer
3 second ferromagnetic layer
4 MgO layer
5 Ru layer
6 CoFe layer
8 antiferromagnetic layer (PtMn)
9 lower electrode layer
10 upper electrode layer
10a upper electrode layer (Ta)
10b upper electrode layer (Ta)
10c upper electrode layer (Cu)
11 antioxidant layer
12, 120 substrate
21 first film forming chamber
22 partitioning plate
23 target mounting portion
24 target (MgO)
25 target mounting portion
26 target (Ta)
27, 28 shutter
29 substrate holder
31 shutter
34 valve
35 vacuum exhausting means
36 adhesion preventing shield 37 film forming chamber inner wall
41 second film forming chamber
42 third film forming chamber
43 carrier chamber
44 load lock chamber
45 unload lock chamber
46 first Ta film forming means
47 MgO film forming means
48 PtMn film forming means
49 CoFe film forming means
50 Ta film forming means
51 Ru film forming means
52 CoFeB film forming means
61a first Ta layer
61b second Ta layer
62 CuN layer
62a first CuN layer
62b second CuN layer
64, 640 lower electrode layer
65 CuN film forming means
66 Mg layer
67 Mg film forming means
68 ground layer (Ta)
69 ground layer (Ru)
80 antiferromagnetic layer (IrMn)
290 substrate placing bed
295 mask

BEST MODE FOR CARRYING OUT THE INVENTION

Figure 2:
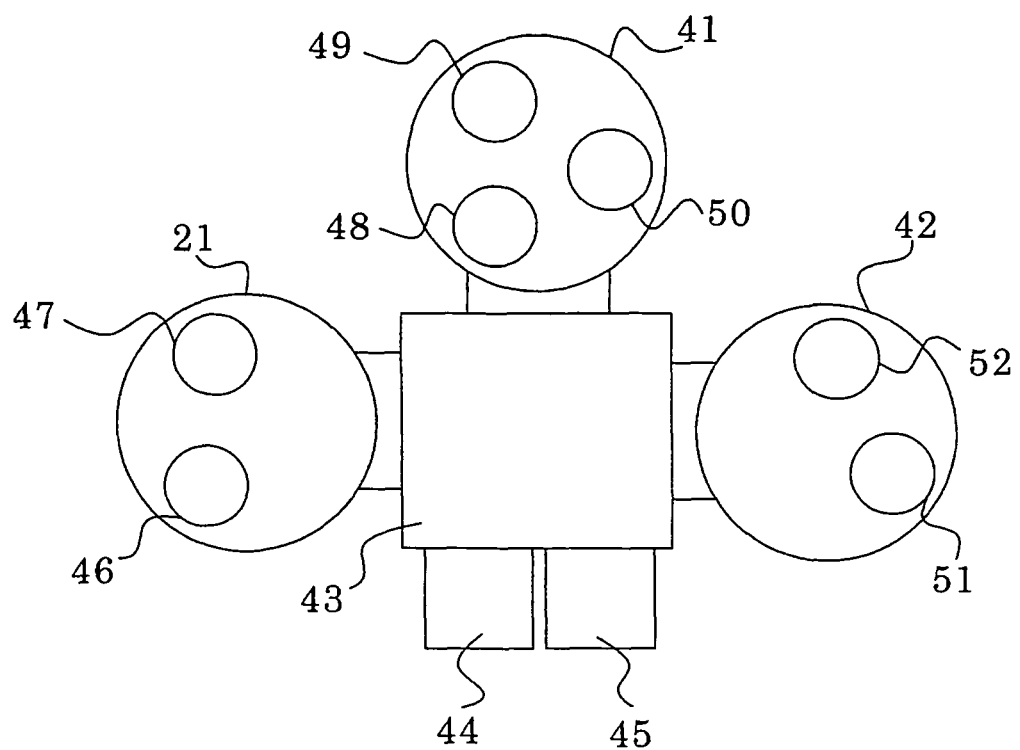
FIG. 2 is a plane pattern diagram showing an example of a configuration of a film forming chamber in a manufacturing apparatus according to the first embodiment of the present invention.
Figure 3:
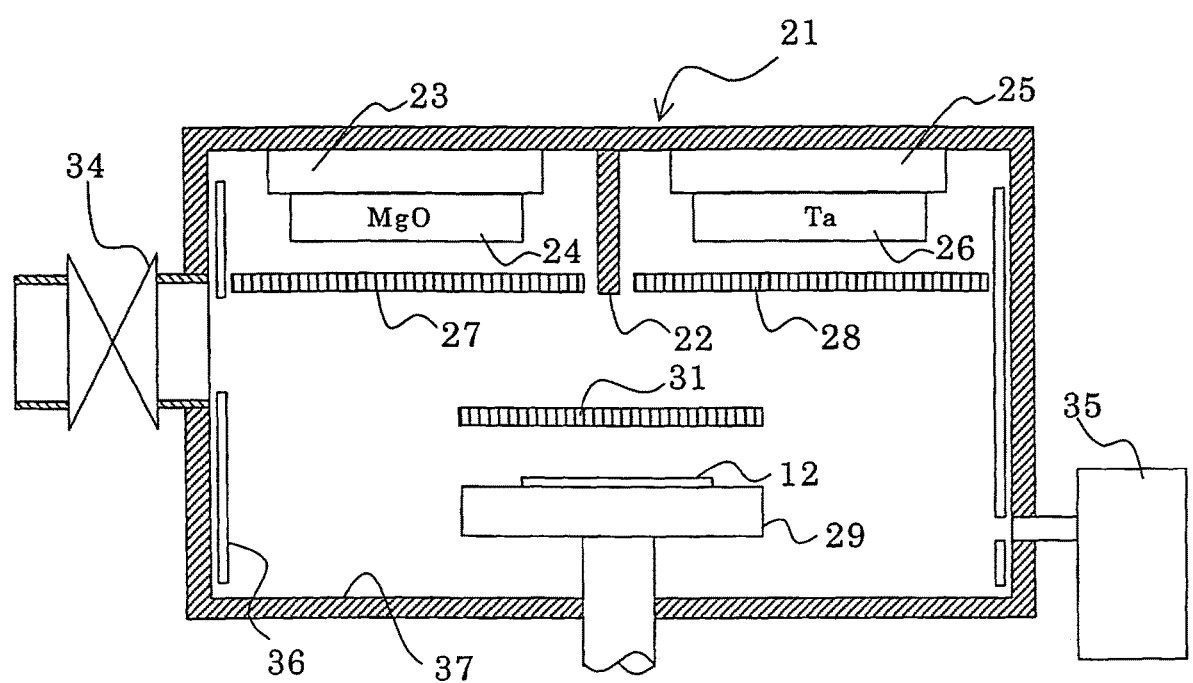
FIG. 3 is a cross-sectional view for explaining an internal configuration of a first film forming chamber in the manufacturing apparatus shown in FIG. 2.

Referring now to FIG. 1, FIG. 2 and FIG. 3, a first embodiment of the present invention will be described. FIG. 1 is a drawing showing an example of a configuration of a thin film of a magnetoresistance effect element having an MgO insulator layer, which is manufactured in the first embodiment.

In FIG. 1, on an Si (silicon) substrate 12 formed with $SiO_2$ (silicon dioxide) on the surface thereof, a lower electrode layer 9 (film thickness: 10 nm) formed of Ta (tantalum), a PtMn (platinum manganese) antiferromagnetic layer 8 (film thickness: 15 nm) formed of PtMn (platinum manganese), a CoFe (cobalt iron) layer 6 (film thickness: 2.5 nm), an Ru (ruthenium) layer 5 (film thickness: 0.85 nm), a first ferromagnetic layer 2 (film thickness: 3 nm) formed of CoFeB (cobalt iron boron), MgO layer 4 (film thickness: 1.0 nm) formed of MgO (magnesium oxide), a second ferromagnetic layer 3 (film thickness: 3 nm) formed of CoFeB, an upper electrode layer 10 (film thickness: 10 nm) formed of Ta, and an Ru layer 11 (film thickness: 7 nm) for preventing oxidation are laminated.

Referring now to FIG. 2, a manufacturing apparatus according to the present invention will be described. FIG. 2 is a plane pattern diagram showing an example of a configuration of a film forming chamber in the manufacturing apparatus according to the first embodiment of the present invention, including a carrier chamber 43, a load lock chamber 44, unload lock chamber 45, a first film forming chamber 21, a second film forming chamber 41 and a third film forming chamber 42 which are each able to exhaust air to a vacuum state. The load lock chamber 44 and the unload lock chamber 45 are connected to the carrier chamber 43 via valves, whereby substrates may be transferred between an outer space at an atmospheric pressure and the interior of the vacuum apparatus. The first film forming chamber 21, the second film forming chamber 41 and the third film forming chamber 42 are connected to the carrier chamber 43 via the valves. Accordingly, mutual transfer among the respective film forming chambers is achieved while maintaining the vacuum state.

The each film forming chamber include film forming means for forming the respective layers described above of the magnetoresistance effect element. In other words, the first film forming chamber 21 is provided with first Ta film forming means 46 and MgO film forming means 47, the second film forming chamber 41 is provided with PtMn film forming means 48, CoFe film forming means 49 and second Ta film forming means 50, and the third film forming chamber 42 is provided with an Ru film forming means 51 and CoFeB film forming means 52. The substrates are transferred through the respective film forming chambers without being exposed to an atmosphere, and are each formed with films in sequence by the film forming means which forms the respective layers of the magnetoresistance effect element.

FIG. 3 is a cross-sectional view for explaining an internal configuration of the first film forming chamber in the manufacturing apparatus shown in FIG. 2. The internal configurations of the second film forming chamber and the third film forming chamber are the same as the first film forming chamber other than that films of different substances are formed respectively. The film forming means in this embodiment employs a spattering method. The first film forming chamber 21 is connected to a carrier chamber via a valve 34, and air-tightness in the interior thereof is maintained by closing the valve 34. The first film forming chamber 21 is provided with a substrate holder 29 for holding a substrate 12 on the lower portion thereof. The surface of the substrate holder 29 is covered with an insulator formed of aluminum nitride.

The film forming means each include a target as a film forming substance and a power supply unit for the target as principal elements. In the upper portion of the first film forming chamber 21, a target 24 formed of MgO is attached to a target mounting portion 23. Also, a target 26 formed of Ta is attached to a target mounting portion 25 by being partitioned by a partitioning plate 22. The target 24 (MgO) and the target 26 (Ta) receive a supply of high-frequency power from a high-frequency power source (not shown in the drawing) via the target mounting portions 23, 25.

A shutter 27 for shielding the target 24 (MgO) and a shutter 28 for shielding the target 26 (Ta) are provided, and the substrate 12 is shielded by a shutter 31. The shutters 27, 28, 31 are each adapted to be retracted individually from positions shown in the drawing according to the spattering of the target 24 (MgO) or the target 26 (Ta). The first film forming chamber 21 is provided with a cylindrical adhesion preventing shield 36 so as to cover the side surface of a film forming chamber inner wall 37. The film forming chamber inner wall, the adhesion preventing shield, the shutters, the partitioning plate or the like are referred to as components, hereinafter.

The first film forming chamber 21 is provided at the lower portion thereof with a vacuum exhausting means 35 for exhausting air from the film forming chamber 21 and bringing the interior thereof into a vacuum state.

Referring now to FIG. 2, a method of carrying out the film forming process to form the magnetoresistance effect element as an example shown in FIG. 1 according to the first embodiment of the invention will be described.

The Si (silicon) substrate 12 formed with $SiO_2$ (silicone dioxide) is carried into the first film forming chamber 21 for forming the film of the lower electrode layer 9 formed of Ta, and is held by the holder 29. The surface of the holder 29 is covered with an insulating substance formed of aluminum nitride, and the substrate 12 is held in an electrically floating state. Air is exhausted from the first film forming chamber 21 to a pressure lower than a background pressure $10^{-7}$ Pa before the film formation, Ar (argon) is introduced into the first film forming chamber 21, the pressure therein is adjusted to a predetermined pressure, the shutter 27, the shutter 28 and the shutter 31 are brought into a closed state, a high-frequency power is applied to the Ta target 26, and a pre-spattering process of Ta is carried out. Subsequently, the shutter 31 and the shutter 28 are brought into an opened state, and a high-frequency power is applied to the Ta target 26 to form a Ta film on the substrate 12. Simultaneously with this, the film forming chamber inner wall 37, the inner walls of the adhesion preventing shield 36, the partitioning plate 22 or the shutters or the like as the components in the interior of the first film forming chamber 21 are partly covered with Ta spattered from the Ta target 26. The areas in which spatter particles are adhered from the Ta target are different depending on the position or the shape of the target, the position or the shape of the components in the film forming chamber, and the film forming conditions. After having spattered for a predetermined time period, the shutter 31 is brought into a closed state, and the high-frequency power to be applied to the Ta target 26 is turned off.

The substrate 12 formed with the Ta lower electrode layer 9 is carried out from the first film forming chamber 21, and is transferred to the second film forming chamber 41 provided with the PtMn film forming means 48 and the CoFe film forming means 49, and held by the holder. The PtMn layer 8 is formed on the substrate using the PtMn film forming means 48, and then the CoFe layer 6 is formed using the CoFe film forming means 49. Subsequently, the substrate 12 is carried out from the second film forming chamber 41, is transferred to the third film forming chamber 42 provided with the Ru film forming means 51 and the CoFeB film forming means 52, and held by the holder. The Ru layer 5 is formed on the substrate using the Ru film forming means 51, and then the CoFeB ferromagnetic layer 2 formed of CoFeB is formed using the CoFeB film forming means 52. In this manner, the PtMn antiferromagnetic layer 8, the CoFe antiferromagnetic layer 6, the Ru layer 5 and the first ferromagnetic layer 2 shown in FIG. 1 are formed in sequence. The background pressure in the respective film forming chambers before film formation is $10^{-7}$ Pa or lower.

The substrate 12 having the layers up to the first ferromagnetic layer 2 laminated thereon in FIG. 1 is carried into the first film forming chamber 21 again for forming next the MgO layer 4 and held by the substrate holder 29. At this time, the surfaces of the components in the first film forming chamber 21 are adhered on top thereof with Ta which has spattered in the step of forming the Ta layer on the substrate. In the film forming chamber in this state, a film of the MgO layer is formed by spattering on the substrate 12. An MgO pre-spattering process is carried out by bringing the shutter 28, the shutter 27 and the shutter 31 in the closed state and applying a high-frequency power to the MgO target 24. Then, the shutter 27 is brought into an opened state, and MgO is spattered for a predetermined time period. Then, the shutter 31 is brought into an opened state, and the MgO layer 4 is formed on the substrate 12.

The substrate 12 is carried out from the first film forming chamber 21, and is moved to the third film forming chamber 42 provided with the CoFeB film forming means 52, where the second ferromagnetic layer 3 formed of CoFeB is formed. Subsequently, the substrate 12 is carried into the first film forming chamber 21 again where the first Ta film forming means 46 is arranged, where the Ta upper electrode layer 10 is formed thereon. Subsequently, the substrate 12 is moved to the third film forming chamber 42 where the Ru film forming means 51 is provided, where the Ru antioxidant layer 11 is formed. The magnetoresistance effect element shown in FIG. 1 thus formed demonstrates a preferable performance having a high MR ratio even though the thickness of the film layer of the MgO is small. Consequently, the magnetoresistance effect element with a high MR ratio is obtained even with a low value of RA.

In the first embodiment of the present invention, the film forming means for the substance whose getter effect with respect to the oxidizing gas is the largest (Ta in this embodiment) from among the substances which constitute the magnetoresistance effect element is provided in the first film forming chamber provided with the film forming means for MgO, so that only the film of the substance whose getter effect with respect to the oxidizing gas is the largest (Ta in this embodiment) from among the substances which constitute the magnetoresistance effect element and the MgO film are formed in the first film forming chamber for forming the MgO film. The getter effect of Ta to be adhered to the surface of the components in the film forming chamber for forming the MgO layer with respect to the oxidizing gas is higher than the getter effect of MgO or CoFeB for forming the first ferromagnetic layer with respect to the oxidizing gas.

Figure 4:
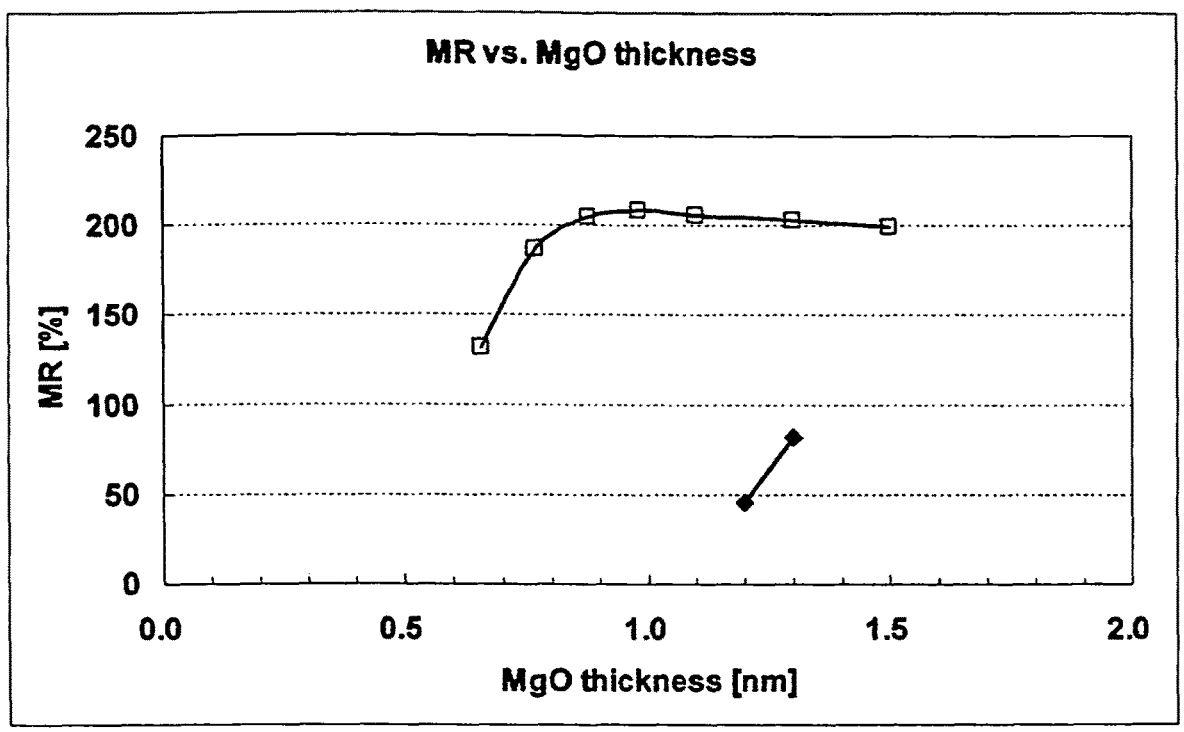
FIG. 4 is a drawing showing a result of comparison of film thickness/MR ratio characteristics of the MgO layer of the magnetoresistance effect element between the manufacturing method according to the present invention and the manufacturing method in the related art.
Figure 5:
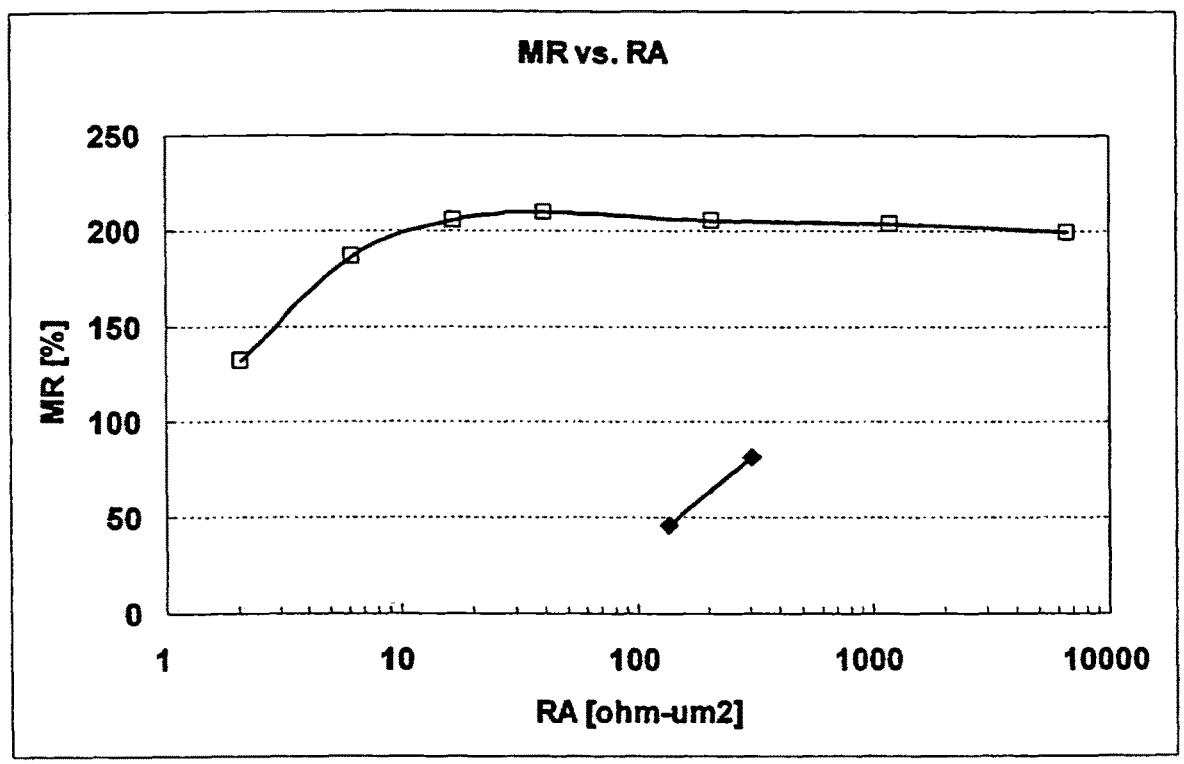
FIG. 5 is a drawing showing a result of comparison of RA/MR ratio characteristics of the MgO layer of the magnetoresistance effect element between the manufacturing method according to the present invention and the manufacturing method in the related art.

FIG. 4 is a drawing showing a result of comparison of the film thickness/MR ratio characteristics of the MgO layer of the magnetoresistance effect element between the manufacturing method according to the present invention and the manufacturing method in the related art, and FIG. 5 is a drawing of comparison of the RA/MR ratio characteristic of the MgO layer of the magnetoresistance effect element between the manufacturing method according to the present invention and the manufacturing method in the related art. In the method in the related art, the Ta lower electrode layer and the Ta upper electrode layer are formed using the second Ta film forming means 50 provided in the second film forming chamber 41. In the method in the related art, the MgO layer is formed in the film forming chamber in which MgO is adhered to the surfaces of the components in the first film forming chamber for forming the MgO layer.

In FIG. 4, the MgO film thickness/MR ratio characteristic of the magnetoresistance effect element manufactured in the manufacturing method in the present invention in which the MgO layer is formed in the film forming chamber to which Ta is adhered is represented by hollow squares (□) and the MgO film thickness/MR ratio characteristic of the magnetoresistance effect element manufactured in the manufacturing method in the related art in which the MgO layer is formed without adhesion of Ta is represented by solid diamonds (♦). While the MR ratio was lowered with reduction of the film thickness of the MgO layer in the manufacturing method in the related art, the magnetoresistance effect element with a high MR ratio was obtained even when the film thickness of the MgO layer was reduced to 0.9 nm according to the manufacturing method in the present invention.

In FIG. 5 as well, the RA/MR ratio characteristic of the magnetoresistance effect element manufactured in the manufacturing method in the present invention is represented by hollow squares (□) and the RA/MR ratio characteristic of the magnetoresistance effect element manufactured in the manufacturing method in the related art is represented by solid diamonds (♦). While the MR ratio when the RA is about 150 $\Omega\mu m^2$ does not reach 50% in the manufacturing method in the related art, the MR ratio when the RA is about 2 Ωμm$^2$ reaches about 130% according to the manufacturing method in the present invention, so that the magnetoresistance effect element with a high MR ratio was obtained with a low value of RA.

According to the first embodiment of the present invention, it is considered that since the surfaces of the components in the film forming chamber when forming the film of MgO were covered with Ta which provides a larger getter effect with respect to the oxidizing gas discharged when forming the MgO film so as to have a high getter effect with respect to the oxidizing gas discharged when forming the MgO film, oxidation of the surface of the ferromagnetic layer 2 and deterioration of the formed film quality of the MgO layer 4 were prevented.

In both of the manufacturing method in the related art and the manufacturing method in the present invention, the respective thin film layers of the magnetoresistance effect element were formed in the film forming chamber which was exhausted into a vacuum state with a background pressure of $10^{-7}$ or lower Pa. Without adhering Ta which is a substance whose getter effect with respect to the oxidizing gas is large to the surfaces of the components in the MgO film forming chamber, lowering of the MR ratio when the thickness of the MgO film is small was not improved even when the magnetoresistance effect element was formed by setting the background pressure to $10^{-7}$ Pa and forming the MgO insulator layer. MgO is a substance of sodium monoxide which easily adsorb water, and the sintered compact of MgO is porous substance, so that it is considered that the oxidizing gas such as oxygen or water is adsorbed to the MgO target. Even when the background pressure is adjusted to $10^{-7}$ Pa by exhausting air, the oxidizing gas adsorbed to the target cannot be exhausted easily, and the oxidizing gas is discharged into a film forming space during MgO film formation from the MgO target which is shocked by ion simultaneously with the start of spattering of MgO. Therefore, it is considered that oxidation of the surface of the ferromagnetic layer formed on the substrate to be processed or deterioration of the film quality of the MgO insulator layer to be formed are resulted, so that the characteristics of the magnetoresistance effect element are deteriorated.

The substance whose getter effect with respect to the oxidizing gas such as oxygen or water is large is not limited to Ta, and Ti, Mg, Zr, Nb, Mo, W, Cr, Mn, Hf, V, B, Si, Al and Ge may also be applicable. An alloy formed of two or more substances whose getter effects with respect to the oxidizing gas are large is also be possible.

In the embodiment described above, since the substance whose getter effect with respect to the oxidizing gas is large to be adhered to the interior of the MgO film forming chamber, the same substance (Ta) was selected for the lower electrode layer 9 and the upper electrode layer 10 which constitute the magnetoresistance effect element, a method of adhering the substance whose getter effect with respect to the oxidizing gas is large (Ta) in the MgO film forming chamber is achieved simultaneously with the film forming steps for Ta the lower electrode layer 9 and the Ta upper electrode layer 10, and hence provision of the specific steps for that is not necessary. Also, since Ta on the Ta lower electrode layer 9 and on the upper electrode layer 10 which constitute the magnetoresistance effect element is formed in the first film forming chamber 21 for forming a film of MgO in the first embodiment, Ta may be adhered relatively thickly and over a wide range to the MgO film forming chamber, so that a large getter effect is achieved.

Furthermore, in the first embodiment, it is also possible to insert a step of adhering Ta to the surface of the components in the first film forming chamber 21 just before forming the MgO layer 4. By inserting such the step, Ta is adhered in addition to Ta which is adhered to the surface of the components in the first film forming chamber 21 in the step of forming the Ta layer which constitutes the magnetoresistance effect element, so that the thickness of Ta to be adhered to the surface of the components in the first film forming chamber 21 and the area to adhere Ta may be increased. In addition, since the Ta may be adhered to the interior of the film forming chamber just before the step of forming the MgO layer, it is considered that a high getter effect is achieved with respect to the oxidizing gas discharged when forming the MgO film.

When the substrate 12 is out of the first film forming chamber 21 (for example, during the film forming process of the first ferromagnetic layer 2), it is also possible to carry out a step of adhering Ta to the surfaces of the components in the first film forming chamber 21 by spattering Ta with the shutter 31 in the closed state using the Ta film forming means provided in the first film forming chamber 21. Accordingly, the thickness of Ta to be adhered to the surfaces of the components in the first film forming chamber 21 may be increased, and the area to be adhered may be increased. Therefore, the getter effect with respect to the oxidizing gas to be discharged when forming the MgO film may be increased. In addition, since this step is carried out in parallel with the film forming step on the substrate, it has an advantage that it is not necessary to increase the process time. The spattering step for adhering Ta to the surfaces of the components in the first film forming chamber 21 may be carried out by placing a dummy substrate on the substrate holder instead of operation to bring the shutter 31 into the closed state.

Figure 6:
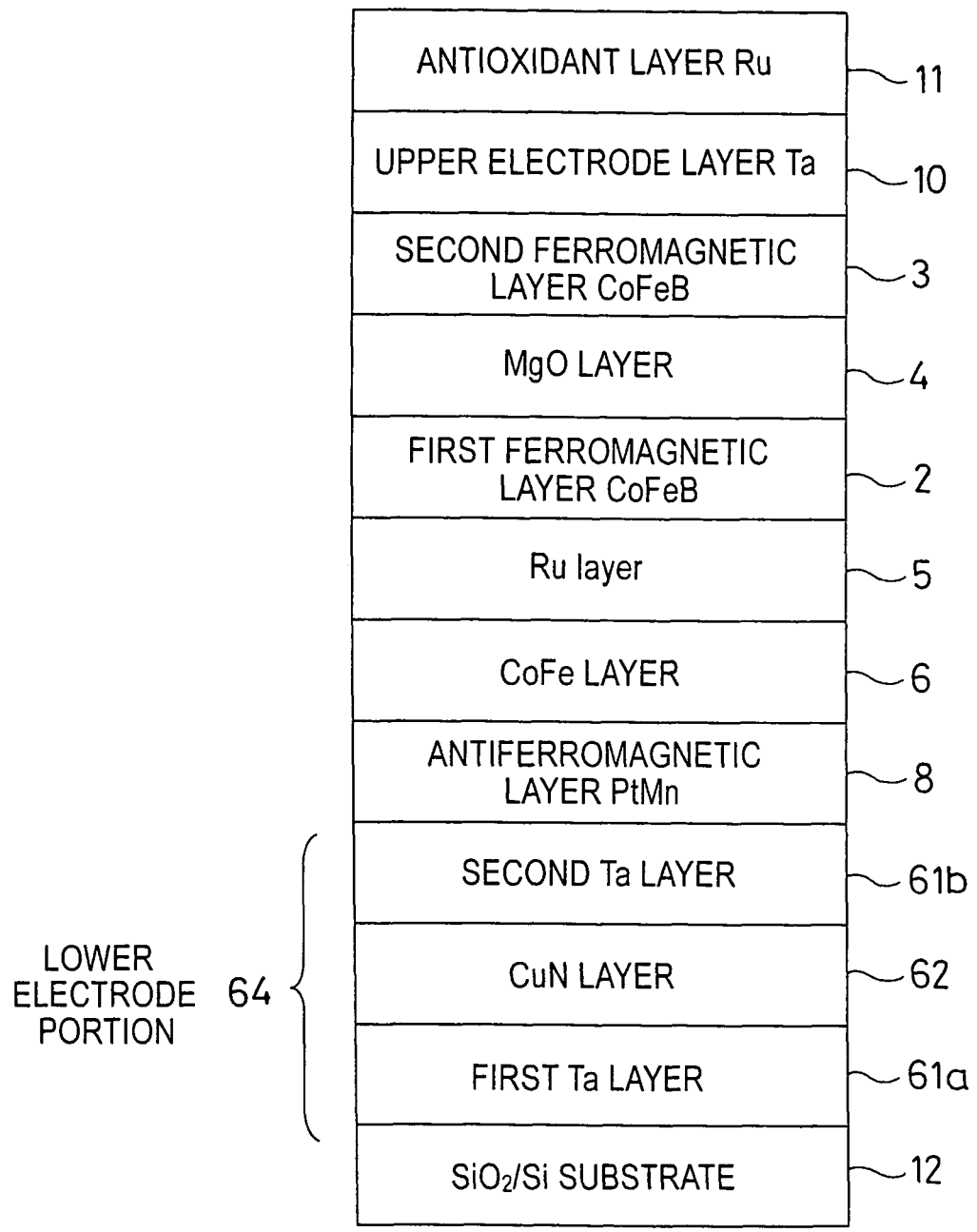
FIG. 6 is a drawing showing an example of a thin film configuration of the magnetoresistance effect element having the MgO insulator layer manufactured in the second embodiment of the present invention.
Figure 7:
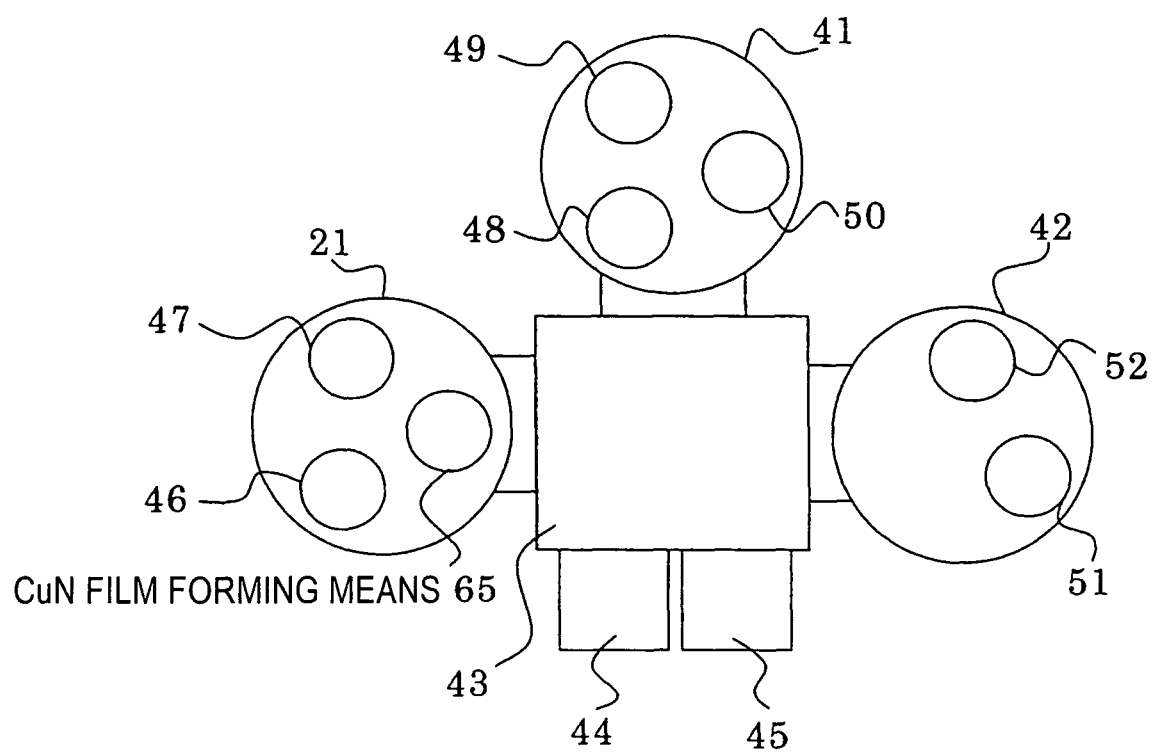
FIG. 7 is a plane pattern diagram showing an example of a configuration of the film forming chamber of a manufacturing apparatus used in the second embodiment of the present invention.

Referring now to FIG. 6 and FIG. 7, a second embodiment will be described.

FIG. 6 is a drawing showing an example of a configuration of a thin film of the magnetoresistance effect element having the MgO insulator layer according to the second embodiment of the present invention. Instead of the lower electrode layer 9 in FIG. 1, a lower electrode portion 64 is formed in FIG. 6. The lower electrode portion 64 includes a first Ta layer 61a, a CuN layer 62, and a second Ta layer 61b. The thin film structures of other portions of the magnetoresistance effect element are the same as those in FIG. 1 according to the first embodiment.

FIG. 7 is a schematic diagram of a manufacturing apparatus used in the second embodiment of the present invention. In FIG. 7, a CuN film forming means 65 is newly provided in the first film forming chamber in the manufacturing apparatus in FIG. 2 which is used in the first embodiment. In other words, as a characteristic of the manufacturing apparatus in the second embodiment, film forming means of a substance whose getter effect with respect to the oxidizing gas is large (Ta) and film forming means of a substance whose getter effect with respect to the oxidizing gas is small (CuN) are both provided in the first film forming chamber having the film forming means for forming the film of MgO.

Referring now to FIG. 6 and FIG. 7, an example of the magnetoresistance effect element regarding a method of film forming process according to the second embodiment of the manufacturing apparatus and the manufacturing method of the present invention.

As regards the Si substrate 12 formed with the SiO$_2$ film, the film formation is carried out in the first film forming chamber 21 in which the first Ta film forming means 46 is provided in order to form the film of the first Ta layer 61a of the lower electrode portion 64 (see FIG. 6). At the same time, Ta is adhered to part of the surfaces of the film forming chamber inner wall 37, the adhesion preventing shield 36, the partitioning plate 22 and the shutters or the like, which are the components in the first film forming chamber 21. Subsequently, using the CuN layer 62 provided in the first film forming chamber 21, the CuN layer 62 of the lower electrode portion 64 is formed (see FIG. 6). Simultaneously, spattered CuN is adhered to the interior of the first film forming chamber 21. Subsequently, using the first Ta film forming means 46 provided in the first film forming chamber 21, a film of Ta is formed on the substrate 12 in order to form the second Ta layer 61b of the lower electrode portion 64 (see FIG. 6). Simultaneously, Ta as the substance whose getter effect with respect to the oxidizing gas is large is adhered to the outermost surface of the components in the first film forming chamber 21. Subsequently, the substrate 12 formed with the Ta lower electrode portion 64 is carried out from the first film forming chamber 21, is moved through the second film forming chamber 41 provided with the respective film forming means for PtMn and CoFe, the third film forming chamber 42 provided with the respective film forming means of Ru and CoFeB in sequence, and the PtMn antiferromagnetic layer 8, the CoFe layer 6, the Ru layer 5 and the first ferromagnetic layer 2 formed of CoFeB are formed in sequence as in the first embodiment. The background pressures in the respective film forming chambers before film formation is $10^{-7}$ Pa or lower.

Then, the substrate 12 is carried into the first film forming chamber 21, and the MgO film is spattered by the MgO film forming means 47. When forming the MgO layer 4, the interior of the first film forming chamber 21 is in a state in which Ta whose getter effect with respect to the oxidizing gas is large is adhered to the surface thereof.

Then, the substrate 12 formed with layers up to the MgO layer 4 moves to the third film forming chamber 42 in which the CoFeB film forming means is provided, where the second ferromagnetic layer 3 formed of CoFeB is formed thereon. In order to form the upper electrode layer 10, the substrate 12 is carried again to the first film forming chamber 21, where the film of Ta is formed on the substrate by the first Ta film forming means. Finally, the substrate is moved to the third film forming chamber 42, and the Ru layer 11 is formed by the Ru film forming means 51, and the magnetoresistance effect element having the thin film structure shown in FIG. 6 is formed.

In the second embodiment of the present invention, both the film forming means for the substance whose getter effect with respect to the oxidizing gas is the largest (Ta in this embodiment) from among the substances which form the thin film layer which constitute the magnetoresistance effect element in this embodiment and the film forming means for the substance whose getter effect with respect to the oxidizing gas is small (CuN in this embodiment) from among the same are provided in the first film forming chamber for forming the film of MgO. Then, after having adhered the substance whose getter effect with respect to the oxidizing gas is small to the surface of the components in the first film forming chamber, the substance whose getter effect with respect to the oxidizing gas is large is adhered thereto, and then the MgO film is formed in a state in which the substance whose getter effect with respect to the oxidizing gas is large is adhered to the interior of the first film forming chamber.

The magnetoresistance effect element shown in FIG. 6 formed in this manner demonstrated a preferable performance having a high MR ratio even though the thickness of the film of the MgO layer was small. Consequently, the magnetoresistance effect element with a high MR ratio was obtained even with a low value of RA. In addition, since the first Ta layer, the CuN layer and the second Ta layer could be formed continuously in the one film forming chamber, the substrate could be carried simply, and the process time may be reduced.

The second embodiment of the present invention includes the film forming means for the substance whose getter effect with respect to the oxidizing gas is small and means for adhering the substance whose getter effect with respect to the oxidizing gas is large to the surfaces of the components in the first film forming chamber for forming the MgO layer, and includes a step of adhering the substance whose getter effect with respect to the oxidizing gas is large (Ta in this embodiment) to the surface of the components in the film forming chamber before forming the film of MgO so that the substance whose getter effect with respect to the oxidizing gas is large is adhered to the surface of the components in the film forming chamber after the substance whose getter effect with respect to the oxidizing gas is small is adhered right before forming the MgO layer.

In the second embodiment of the present invention, the film forming means for the MgO film, the film forming means for Ta and the film forming means for CuN are provided in the film forming chamber for forming the MgO layer. Ta has the highest getter effect with respect to the oxidizing gas from among the substances to be adhered by the film forming means. Also, the getter effect of Ta to be adhered to the surfaces of the components in the film forming chamber for forming the MgO layer with respect to the oxidizing gas is larger than the getter effect of the CoFeB which constitutes MgO or the first ferromagnetic layer with respect to the oxidizing gas.

Figure 8:
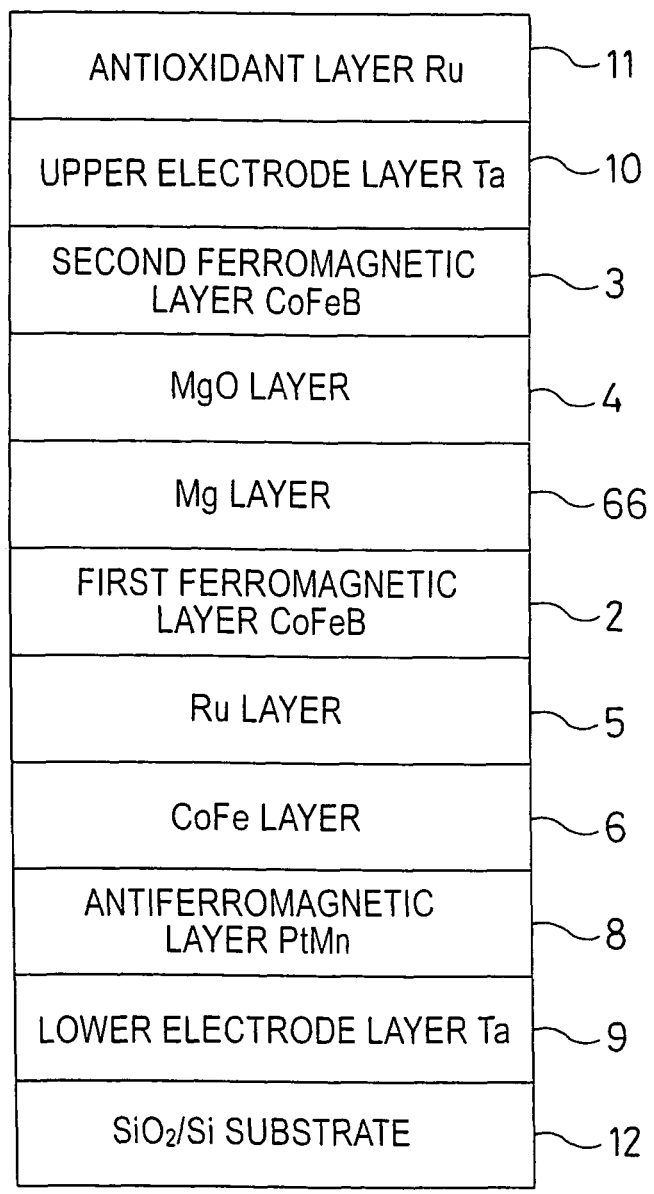
FIG. 8 is a drawing showing an example of the thin film configuration of the magnetoresistance effect element having the MgO insulator layer which is manufactured in the third embodiment of the present invention.
Figure 9:
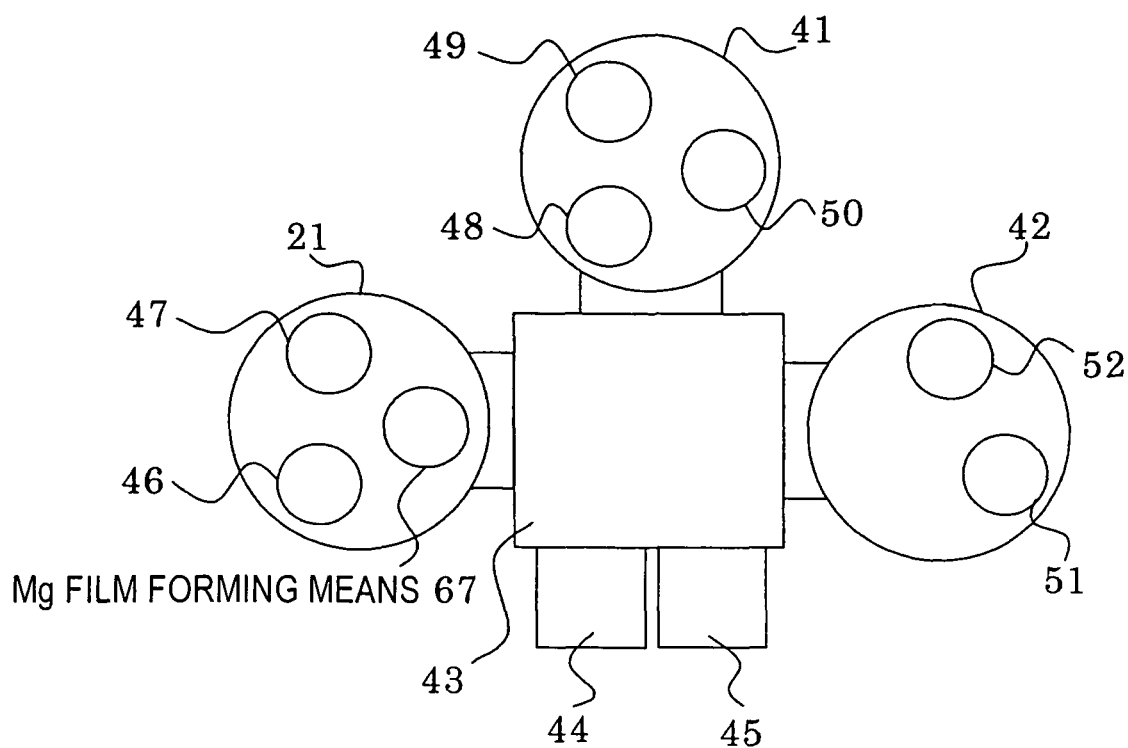
FIG. 9 is a plane pattern diagram showing an example of a configuration of the film forming chamber of a manufacturing apparatus used in the third embodiment of the present invention.

Referring now to FIG. 8 and FIG. 9, a third embodiment will be described.

FIG. 8 is a drawing showing an example of the thin film configuration of the magnetoresistance effect element having the MgO insulator layer in the third embodiment of the present invention. As shown in FIG. 8, in the third embodiment, an Mg layer 66 is provided under the MgO layer 4 in the thin film configuration of the magnetoresistance effect element in FIG. 1.

FIG. 9 is a schematic diagram of the apparatus of manufacturing used in the third embodiment. The manufacturing apparatus used in the third embodiment in FIG. 9 is provided newly with an Mg film forming means 67 in the first film forming chamber in the manufacturing apparatus used in the first embodiment.

The Si substrate 12 formed with $SiO_2$ on the surface thereof is carried into the first film forming chamber 21 to form the lower electrode layer 9 of Ta on the substrate 12. Simultaneously, Ta spattered from the Ta target 26 is adhered on part of the film forming chamber inner wall 37, the adhesion preventing shield 36, the partitioning plate 22 or the shutter or the like in the interior of the first film forming chamber 21.

Subsequently, the substrate 12 is moved through the second film forming chamber 41 provided with the respective film forming means for PtMn and CoFe and the third film forming chamber 42 provided with the respective means for Ru and CoFeB in sequence, and the substrate formed with layers up to the PtMn antiferromagnetic layer 8, the CoFe layer 6, the Ru layer 5 and the first ferromagnetic layer 2 formed of CoFeB shown in FIG. 9 are formed in sequence.

The respective thin film layers are formed by exhausting the air from the respective film forming chambers to achieve a background pressure of $10^{-7}$ Pa or lower.

The substrate 12 formed with the layers up to the ferromagnetic layer 2 in sequence is carried again into the first film forming chamber 21 to spatter the Mg target of the Mg film forming means 67 and form the Mg layer 66. Simultaneously, Mg spattered from the Mg target is adhered on part of the film forming chamber inner wall 37, the adhesion preventing shield 36, the partitioning plate 22 or the shutter in the interior of the first film forming chamber 21. Mg is a substance whose getter effect with respect to the oxidizing gas is large, and is a substance whose getter effect with respect to oxygen or water or the like is large. The MgO target of the MgO film forming means 47 is spattered to spatter the MgO layer 4 on the substrate 12 in the state of the film forming chamber as described above.

The substrate 12 formed with layers up to the MgO layer 4 is moved to the third film forming chamber 42, where the second ferromagnetic layer 3 formed of CoFeB is formed thereon. Subsequently, the substrate moves again to the first film forming chamber 21 to form the Ta upper electrode layer 10 thereon. Then, the substrate 12 is moved to the third film forming chamber 42 to form the Ru layer. In this manner, the magnetoresistance effect element having the thin film configuration shown in FIG. 8 is formed.

The magnetoresistance effect element formed in this manner demonstrated a preferable performance having a high MR ratio even though the thickness of the film of the MgO layer is small. Consequently, the magnetoresistance effect element with a high MR ratio was obtained even with a low value of RA.

In this embodiment, the substance whose getter effect with respect to the oxidizing gas to be adhered to the surfaces of the components in the first film forming chamber for forming the film of MgO is large is Mg.

Since the MgO layer is formed continuously after the Mg layer, Mg is adhered to the surfaces of the components in the first film forming chamber right before forming the film of MgO, and hence it is considered that a high getter effect is obtained from Mg to be adhered to the surfaces of the components in the first film forming chamber for forming the film of MgO in this embodiment. The extent of the getter effect with respect to the oxidizing gas varies depending on the state of the surface of the substance. Since the Mg film is adhered to the surfaces of the components in the film forming chamber right before forming the MgO layer, the surface of the adhered Mg film is in a clean state, so that it is considered that a higher getter effect is achieved.

In this embodiment in which the Mg layer is formed in the film forming chamber for forming the MgO layer and, in addition, the Ta layer is formed, since Mg and Ta, which are substances whose getter effects with respect to the oxidizing gas are large, are adhered to the surfaces of the components in the MgO film forming chamber, the substances whose getter effect with respect to the oxidizing gas is large may be formed further thickly and over a larger area, so that the higher effect is achieved. However, it does not mean that the Ta electrode layer must be formed in the MgO film forming chamber, and the same effect is achieved even when only the Mg layer is formed in the MgO film forming chamber and the Ta layer is formed in a film forming chamber different from the film forming chamber for forming the MgO layer.

Figure 10:
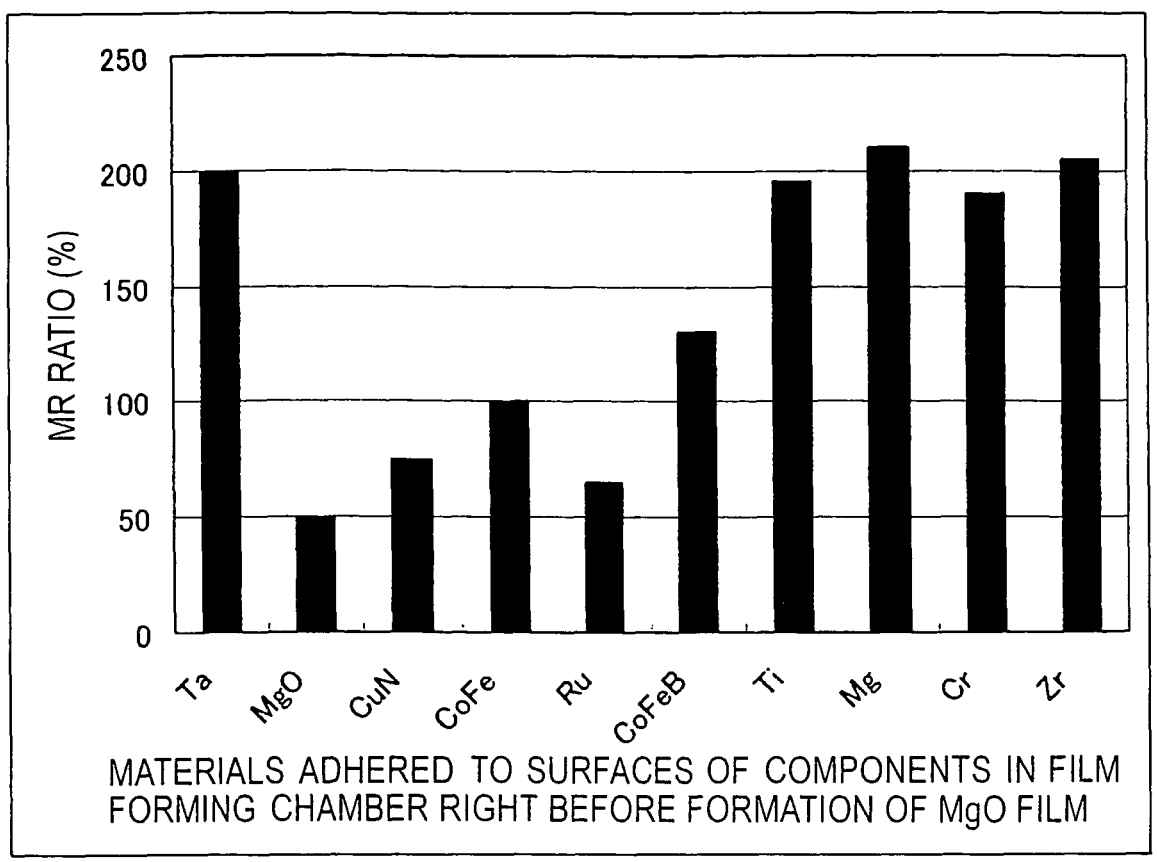
FIG. 10 is a drawing showing a result of comparison of measured MR ratios of the magnetoresistance effect elements obtained by forming the MgO layer on the substrates 12 having the configuration shown in FIG. 1 in a state in which various substances are adhered to the surfaces of the components in the first film forming chamber for forming the MgO layer right before forming the MgO layer on the substrates 12.

Referring now to FIG. 10, a fourth embodiment will be described. FIG. 10 is a drawing showing a result of comparison of measured MR ratios of the magnetoresistance effect elements obtained by forming the MgO film on the substrates 12 having the configuration shown in FIG. 1 in a state in which various substances are adhered to the surfaces of the components in the first film forming chamber for forming the MgO layer right before forming the MgO layer on the substrates 12.

The method of execution will be described according to an example in which Ti is employed as the substance to be adhered to the surfaces of the components in the first film forming chamber for forming the film of MgO. The Ti film forming means is provided in the first film forming chamber in addition to the MgO film forming means, the Ta film forming means. The layers up to the first ferromagnetic layer 2 are laminated in sequence on the substrate 12. Ta is adhered to the surfaces of the components in the first film forming chamber when the Ta lower electrode layer is formed. A step of adhering Ti in the first film forming chamber 21 is inserted right before forming the MgO layer 4. In other words, the magnetoresistance effect element is formed by carrying the substrate 12 having laminated with layers up to the first ferromagnetic layer 2 in sequence to the first film forming chamber 21, holding the same by the substrate holder 29, opening the target shutter of Ti in a state in which the shutter 31 is closed and hence the substrate 12 is shielded, and sputtering Ti to adhere Ti to the surfaces of the film forming chamber inner wall 37, the adhesion preventing shield 36, the shutter and the partitioning plate 22. Subsequently, in this state, the MgO layer 4 is formed on the substrate 12 in the same manner as the first embodiment. Thereafter, the thin film is laminated in the same manner as in the first embodiment, so that the magnetoresistance effect element is formed.

In this manner, the magnetoresistance effect element is formed by forming the MgO layer in a state in which various substances are adhered to the surfaces of the components in the film forming chamber, and the MR ratios were measured. Consequently, while the MR ratio was about 50% when the MgO layer is spattered by adhering MgO, the values of MR ratio of about 70 to 130% were obtained when the MgO layer is spattered by adhering CuN, CoFe, Ru and CoFeB. It was found that the values of the MR ratio obtained when spattering the MgO layer by adhering Ta, Ti, Mg, Cr and Zr were as high as about 190% to 210%. As long as the substance to adhere to the surfaces of the components in the film forming chamber for forming the film of MgO is a substance whose getter effect is larger than MgO, the effect to improve the element characteristic is achieved. Further preferably, when Ti, Cr, Zr or the like other than Ta in the first and second embodiments and Mg in the third embodiment of the present invention are selected as needed as a substance to be adhered to the surfaces of the components in the film forming chamber for forming the film of MgO, good effect to improve the element characteristic is achieved.

The extent of getter effect with respect to the oxidizing gas may be compared with an index of the value of the oxygen gas adsorption energy of the substance in question. On the other hands, the values of the oxygen gas adsorption energy of Ti, Ta, Mg, Cr and Zr having a high MR ratio are larger than 145 kcal/mol. The substance whose value of oxygen gas adsorption energy is larger than 145 kcal/mol, that is, whose getter effect with respect to the oxidizing gas is large is adhered to the surfaces of the components in the MgO film forming chambers, so that the oxygen gas discharged when forming the film of MgO is sufficiently gettered on the surfaces of the components to the MgO film forming chamber. Accordingly, the magnetoresistance effect element being subjected to less oxidation of the surface of the ferromagnetic layer or deterioration of the film quality of the formed MgO insulator layer was formed.

From the fact described above, it is considered that a desirable device performance with a high MR ratio may be obtained even with a low RA when the magnetoresistance effect element is formed by forming the insulator layer MgO film in a state in which the substance whose getter effect with respect to the oxidizing gas is large is adhered to the surfaces of the components in the film forming chamber. Therefore, even when the substance is a substance other than Ta, Ti, Mg, Cr and Zr in this embodiment, it is considered that the magnetoresistance effect element with a high MR ratio is obtained even with a low RA by gettering the oxidizing gas such as oxygen or water discharged during the film forming process of the MgO layer sufficiently as long as it is a substance whose getter effect with respect to the oxidizing gas is large. For example, the effect seems to be achieved even with Nb, Mo, W, Mn, Hf, V, B, Si, Al and Ge whose values of oxygen gas adsorption energy is larger than 145 kcal/mol.

The substance adhered to the film forming chamber inner wall for forming the film of MgO must simply includes a substance whose getter effect with respect to the oxidizing gas is large as a main component.

When a substance whose getter effect with respect to the oxidizing gas is large is not included in the substances which constitute the magnetoresistance effect element, the substance to be adhered to the surfaces of the components in the MgO film forming chamber may be formed by selecting a substance whose getter effect with respect to the oxidizing gas is large as needed, and providing the film forming means for the corresponding substance in the MgO film forming chamber.

A substance whose value of the oxygen gas adsorption energy is 145 kcal/mol or higher is selected as the substance to be adhered to the surfaces of the components in the MgO film forming chamber, so that the oxidizing gas such as oxygen or water to be discharged at the time of forming the film of MgO is sufficiently gettered on the surfaces of the components in the MgO film forming chamber.

The timing to be adhered to the interior of the MgO film forming chamber is more preferably right before the formation of the MgO film, because it is considered that the extent of the getter effect with respect to the oxidizing gas varies depending on the state of the surface of the substance, and the higher getter effect is obtained when the surface is in a clean state.

Preferably, the substance to be adhered to the interior of the MgO film forming chamber is specifically Ta, Ti, Mg, Zr, Nb, Mo, W, Cr, Mn, Hf, V, B, Si, Al and Ge.

When the substance to be adhered in the interior of the MgO film forming chamber is a substance which forms a thin film layer which constitutes the magnetoresistance effect element to be manufactured, the means for adhering to the interior of the MgO film forming chamber may be used commonly as the means for forming the thin film layer and the steps therefor may be commonly carried out by one step, so that the apparatus may be downsized, and the shortening of the entire process is achieved.

Figure 11:
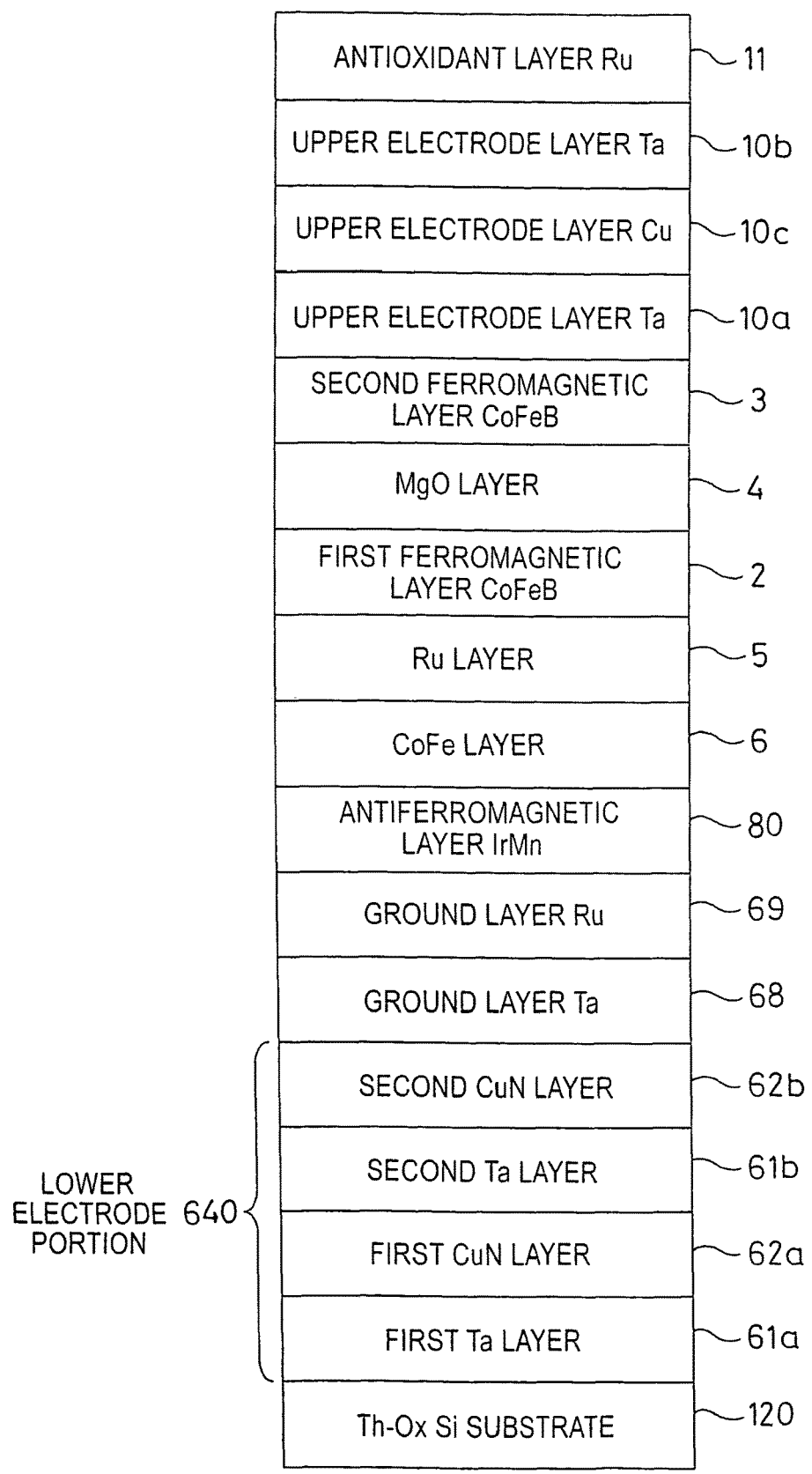
FIG. 11 is a drawing showing an example of the thin film configuration of the magnetoresistance effect element having the MgO layer which is manufactured in the fifth embodiment of the present invention.
Figure 12:
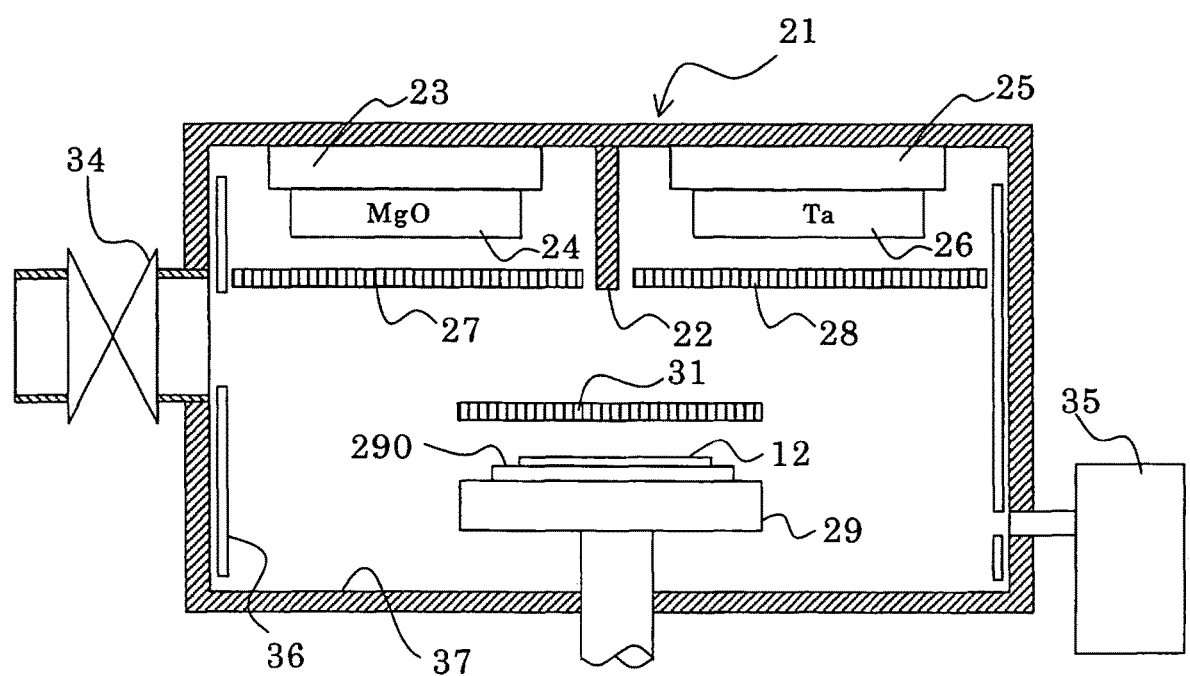
FIG. 12 is a cross-sectional view for explaining the internal configuration of the first film forming chamber in the manufacturing apparatus in the fourth embodiment of the present invention.
Figure 13:
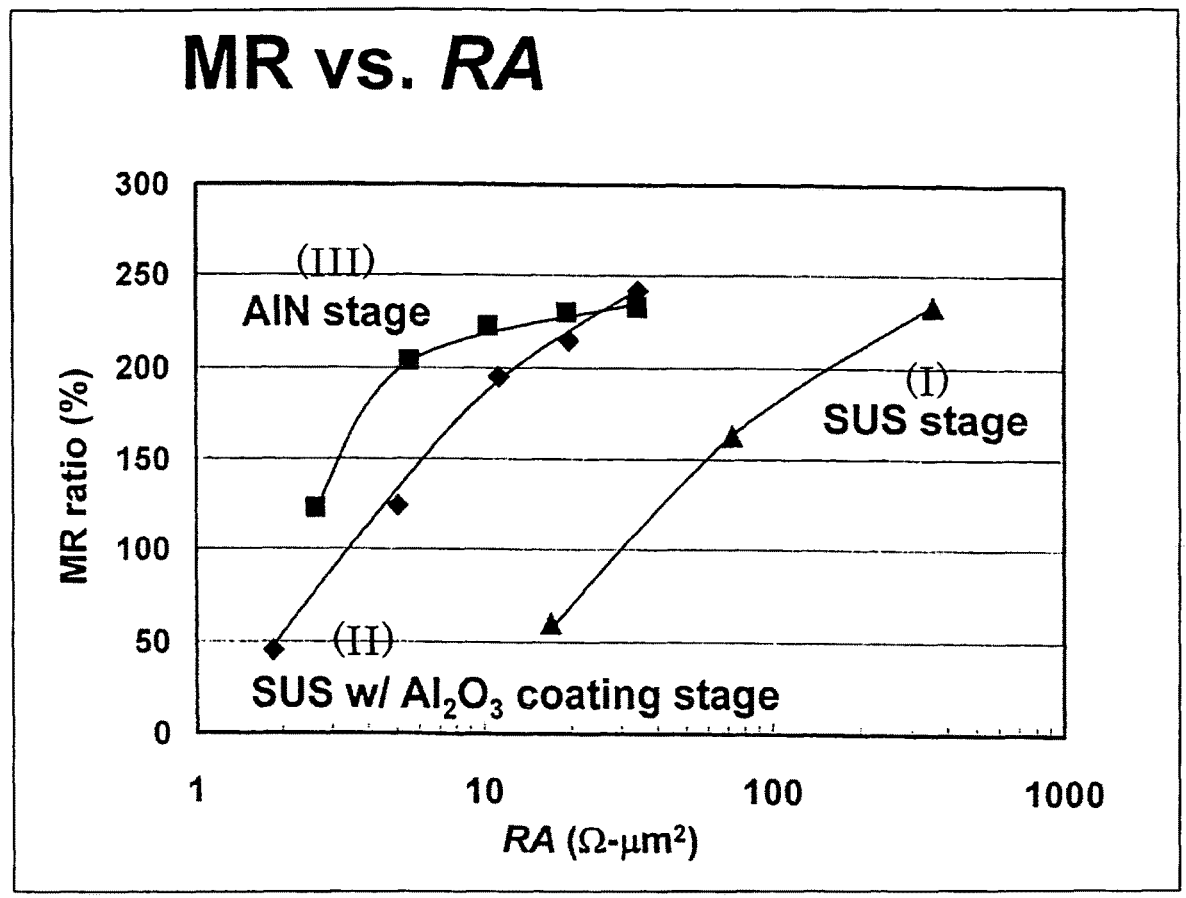
FIG. 13 is a drawing showing RA/MR ratio characteristics of the MgO layer of the magnetoresistance effect element according to the fourth embodiment of the present invention.

Referring now to FIG. 11 to FIG. 13, a fifth embodiment will be described. FIG. 11 is a drawing showing an example of the configuration of a thin film of the magnetoresistance effect element having the MgO layer which is manufactured in the fifth embodiment of the present invention, FIG. 12 is a cross-sectional view for explaining the internal configuration of the first film forming chamber in the manufacturing apparatus in the fifth embodiment of the present invention, and FIG. 13 is a drawing showing an RA/MR ratio characteristic of the MgO layer of the magnetoresistance effect element according to the fifth embodiment of the present invention. The components having substantially the same function or the same configuration as those in FIG. 1, FIG. 3, FIG. 6 and FIG. 8 are designated by the same reference numerals for description, and detailed description of the identical components is omitted.

As shown in FIG. 11, the thin film configuration of the magnetoresistance effect element having the MgO layer to be manufactured in this embodiment includes a lower electrode portion 640 including the first Ta layer 61a (film thickness: 5.0 nm), a first CuN layer 62a (film thickness: 20 nm), a second Ta layer 61b (film thickness: 3.0 nm) and the second CuN layer 62b (film thickness: 20 nm), a ground layer including a Ta layer, 68 (film thickness: 3.0 nm) and an Ru layer 69 (film thickness: 5.0 nm), an antiferromagnetic layer 80 (film thickness: 7.0 nm) formed of IrMn (iridium manganese), the CoFe antiferromagnetic layer 6 (film thickness: 2.5 nm), the Ru layer 5 (film thickness: 0.85 nm), the first ferromagnetic layer 2 (film thickness: 3.0 nm) formed of CoFeB, the insulator layer 4 (film thickness: 1.0 nm) formed of MgO, the second ferromagnetic layer 3 (film thickness: 3.0 nm) formed of CoFeB, an upper electrode layer including a Ta layer 10a (film thickness: 8.0 nm), a Cu layer 10c (film thickness: 30 nm) and a Ta layer 10b (film thickness: 5.0 nm), and the Ru layer 11 (film thickness: 7.0 nm) for preventing oxidation laminated on a Si (silicon) substrate 120 formed with Th-Ox (single layer heat oxidizing film) on the surface thereof. The ground layer including the Ta layer 68 and the Ru layer 69 is for causing crystal growth of the anti-ferromagnetic layer.

The apparatus for manufacturing the magnetoresistance effect element having the MgO layer according to this embodiment has substantially the same configuration as the film forming apparatus shown in FIG. 2 and FIG. 7. However, the first film forming chamber 21 is configured as shown in FIG. 12. In the first embodiment, the description is given about the configuration in which the surface of the substrate holder 29 is covered with the insulator formed of aluminum nitride (AlN). However, the manufacturing apparatus in this embodiment is characterized in that a substrate placing bed 290 is provided between the substrate holder 29 and the substrate 12, and the substrate 12 is directly placed on the substrate placing bed 290. The substrate placing bed 290 must simply have a configuration which is able to insulate at a portion where the substrate holder 29 and the substrate 12 come into contact with each other and, for example, it is also applicable to configure the substrate placing bed 290 by spraying the insulating substance such as $Al_2O_3$ (alumina) on the surface of the stainless steel plate or to configure the substrate placing bed 290 by itself with the insulating substance. In this manner, the substrate 12 is brought into a state of electrically floated completely (floating state), that is, the substrate 12 is brought to have a floating potential. What is essential is that the substrate 12 is electrically insulated from the substrate placing bed 290 and the substrate holder 29. The surface of the substrate holder 29 by itself according to this embodiment does not have to be covered with the insulator.

Here, bringing the substrate 12 to have the floating potential, for example, is achieved by means such as insulating the substrate placing bed 290 from the substrate holder 29, or insulating the substrate holder 29 from the ground in addition to insulating the substrate 12 from the substrate placing bed 290 as described above. What is essential is that the substrate 12 is insulated from the ground at any portion between the substrate 12 and the ground. There are various methods of insulating such as interposing an insulating substance, configuring the components such as the substrate placing bed 290 or the substrate holder 29 by itself with the insulating substance, configuring only the portion to be insulated (portion to come into contact) with an insulating substance, or keeping the portions to be insulated from each other apart from each other.

The method of manufacturing the magnetoresistance effect element having the MgO layer in this embodiment is characterized in that the substrate holder 29 is insulated from the substrate 12, and the MgO layer 4 is formed in the state in which the substrate 12 is electrically floated completely (floating state) as described above. The step of forming the MgO layer 4 on the substrate 12 in the state in which the substance whose getter effect with respect to the oxidizing gas is large (Ta or the like) is adhered to the surface of the components in the interior of the first film forming chamber 21 for forming MgO layer 4 and other film forming steps are the same as that in the embodiment which is already described, so that detailed description is omitted.

When spraying $Al_2O_3$ on the surface of the stainless steel panel to configure the substrate placing bed 290, the substrate 12 is brought into the floating state by spraying the $Al_2O_3$ to a thickness of about 0.2 mm. The substrate 12 is also brought into the floating state by configuring the substrate placing bed 290 by itself by an AlN panel (thickness of about 14 mm) as the insulating substance. Therefore, the magnetoresistance effect element having the MgO layer is manufactured in such the configuration, and the RA/MR ratio characteristics of the MgO layer of the magnetoresistance effect element are compared (FIG. 13). In FIG. 13, (I) represents the characteristic when the substrate placing bed 290 formed of the stainless steel panel is used, (II) represents the characteristic when the substrate placing bed 290 on which $Al_2O_3$ is sprayed by a thickness of about 0.2 mm on the surface of the stainless steel panel is used, and (III) represents the characteristic when the substrate placing bed 290 formed of an AlN panel of a thickness of about 14 mm is used. The reason when AlN is selected in the case of (III) is because its coefficient of thermal conductivity is high.

As shown in FIG. 13, for example, in the case of (I) where the substrate placing bed 290 formed of the stainless steel panel is used with an RA of 10 $\Omega$-$\mu m^2$, the MR ratio is lowered to about 50%. However, in the case (II) where the substrate placing bed 290 obtained by spraying $Al_2O_3$ on the surface of the stainless steel panel is used and in the case (III) where the substrate placing bed 290 formed of AlN panel is used, an MR ratio as high as 200% or more was achieved. Therefore, by forming the film by placing the substrate 12 on the substrate holder 29 via the insulating substance (the substrate placing bed 290) as in the first embodiment, the extent of lowering of the MR ratio is small even in the low RA area, so that a higher MR ratio is obtained in comparison with the case in the related art, so that achievement of both the low RA and the high MR ratio, which is considered to be difficult in the related art, may be realized.

As is clear from the point where the value of Ra is 5 $\Omega$-$\mu m2$, the higher MR ratio is obtained in the case in which the case (III) where the substrate placing bed 290 formed of AlN panel is used than in the case (II) where the substrate placing bed 290 obtained by spraying $Al_2O_3$ on the surface of the stainless steel panel. Therefore, the subject to achieve low RA and high MR ratio is realized further preferably. The thin film configuration (FIG. 11) of the magnetoresistance effect element manufactured according to the present embodiment is different from the thin film configuration (FIG. 1, FIG. 6, FIG. 8) of the magnetoresistance effect element in the respective embodiments described already above in the antiferromagnetic layer 80 formed of IrMn (iridium manganese) and the ground layer (the Ta layer 68 and the Ru layer 69) or the like. However, the same results as described above may be obtained by bringing the substrate 12 into the floating state in the apparatus or the method of manufacturing the magnetoresistance effect element having the thin film configuration shown in the respective embodiments as well.

Figure 14:
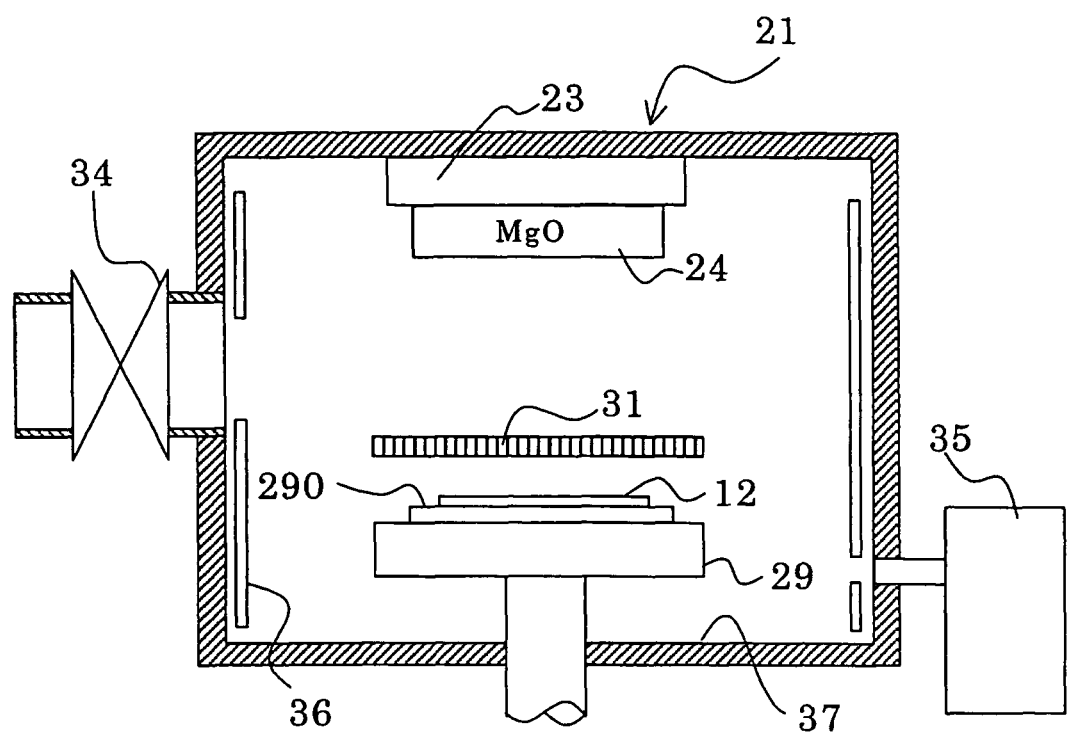
FIG. 14 is a cross-sectional view for explaining the internal structure of the first film forming chamber of the manufacturing apparatus in the sixth embodiment of the present invention.

Referring now to FIG. 14, a sixth embodiment will be described. FIG. 14 is a cross-sectional view for explaining the internal structure of the first film forming chamber of the manufacturing apparatus in the sixth embodiment of the present invention. The components having substantially the same function or the same configuration as those in FIG. 3 and FIG. 12 are designated by the same reference numerals for description, and detailed description of the identical components is omitted.

In the fifth embodiment described above, the film forming apparatus or the film forming method for forming the MgO layer 4 on the substrate 12 in a state in which the substance whose getter effect with respect to the oxidizing gas is large (Ta or the like) is adhered to the surfaces of the components in the interior of the first film forming chamber 21 for forming the MgO layer 4 has been described. However, the invention is not necessarily limited to be the state in which the above-described substance is adhered. In other words, the sixth embodiment is characterized in that the MgO layer 4 is formed in a state in which the substrate holder 29 is insulated from the substrate 12 and the substrate 12 is electrically floating completely (the state at the floating potential) without adhering the above-described substance (Ta or the like) to the surfaces of the components in the interior of the first film forming chamber 21 for forming the MgO layer 4. Therefore, in the manufacturing apparatus in this embodiment, the same substrate placing bed 290 which is the same as the substrate placing bed 290 in the fifth embodiment described above is provided between the substrate holder 29 and the substrate 12, and the substrate 12 is directly placed on the substrate placing bed 290. In this embodiment, since the above-described substance (Ta or the like) is adhered to the surface of the components in the interior of the first film forming chamber 21 for forming the MgO layer 4, the interior of the first film forming chamber 21 must simply be arranged only for MgO as a target as shown in FIG. 14, and it is not specifically necessary to provide the Ta 26 as a target, the target mounting portion 25, the partitioning plate 22, the shutters 27 and 28 (see FIG. 12). Consequently, the extent of lowering of the MR ratio is small even in the low RA area as shown in FIG. 13, and a larger MR ratio than in the related art is obtained.

Figure 15A:
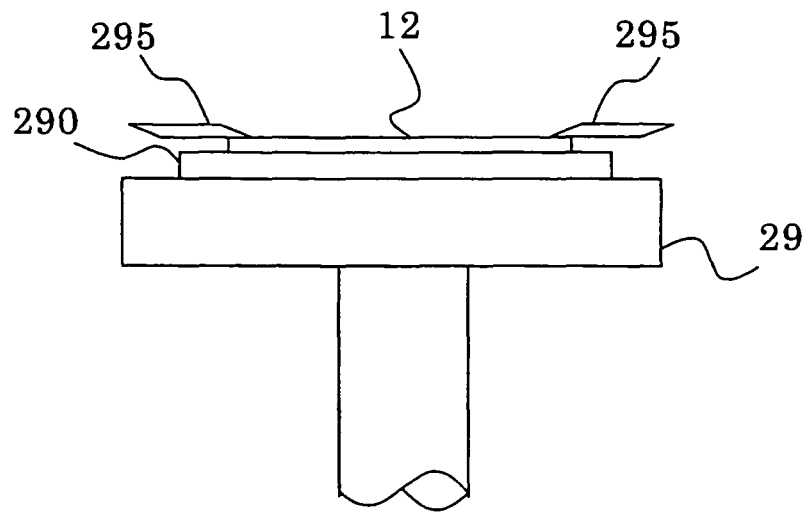
FIG. 15A and FIG. 15B are drawings showing a configuration of the portion near the substrate holder in the manufacturing apparatus in the seventh embodiment of the present invention.
Figure 15B:
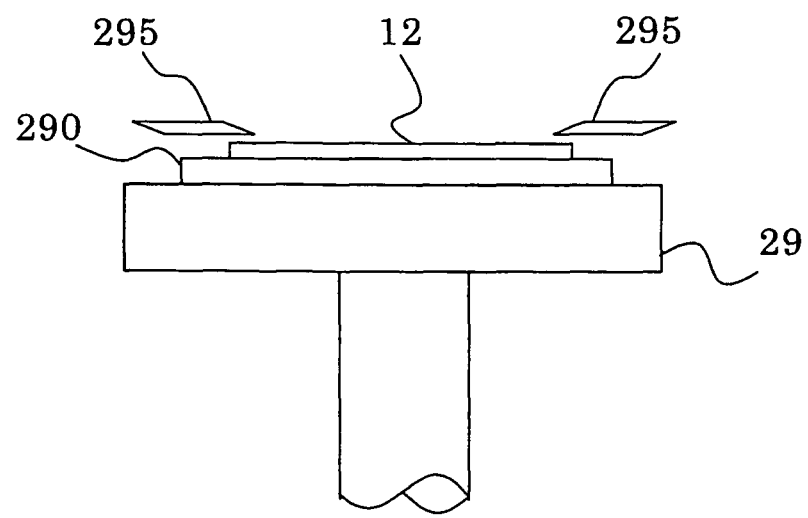
Figure 16:
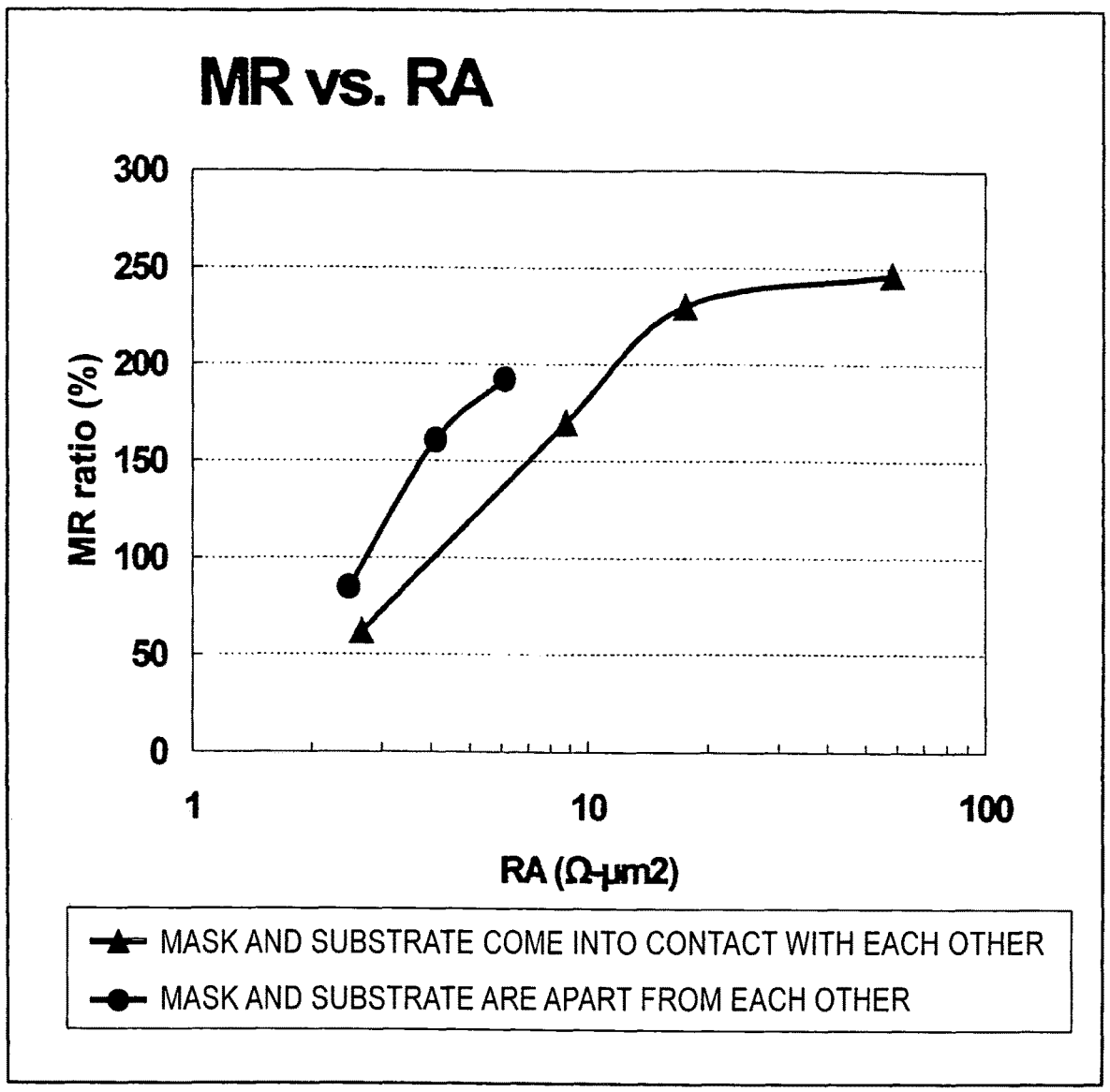
FIG. 16 is a drawing showing the RA/MR ratio characteristic of the MgO layer of the magnetoresistance effect element according to seventh embodiment of the present invention.

Referring now to FIG. 15 and FIG. 16, a seventh embodiment will be described. FIG. 15 is a drawing for showing a configuration of the portion near the substrate holder in the manufacturing apparatus in the seventh embodiment of the present invention in which (a) is a drawing showing a state in which a mask and the substrate are in contact with each other, (b) is a drawing showing a state in which the mask and the substrate are apart from each other, and FIG. 16 is a drawing showing the RA/MR ratio characteristic of the MgO layer of the magnetoresistance effect element according to this embodiment. The components having substantially the same function and the same configuration as those in FIG. 3, and FIG. 12 are designated by the same reference numerals for description, and detailed description of the identical components is omitted.

In general, when forming the film in a state in which the substrate is held by the substrate holder, the metallic mask for covering the peripheral portion of the substrate for holding the same is employed in order to prevent the film from being formed on the back side of the substrate (the side which comes into contact with the substrate holder) by film forming particles running to the backside thereof (see FIG. 15(a), reference numeral 295). As regards this point, this embodiment is adapted to carry out the step of forming the MgO layer 4 in a state of providing the substrate placing bed 290 described above between the substrate holder 29 and the substrate 12, placing the substrate 12 directly on the substrate placing bed 290, and keeping a metallic mask 295 apart from the substrate 12 in the state in which the substrate 12 is at the floating potential as shown in FIG. 15(b). It is also possible to bring the substrate 12 to a state of being at the floating potential by other methods described above. The mask 295 and the substrate 12 must simply be kept apart from each other by a distance which is able to prevent spatter particles from running to the backside of the substrate 12, and for example, is set to 0.5 mm. In this manner, by bringing the mask 295 and the substrate 12 apart from each other, the mask 295 and the substrate 12 are brought into the electrically insulated state.

In the present invention, the mask is a component for covering the peripheral portion of the substrate for preventing the film from being formed by the film forming particles running to the backside of the substrate in a case of carrying out the film forming process on the substrate.

In a step of forming the MgO layer 4, the magnetoresistance effect element having the MgO layer is manufactured on the basis of the respective cases where the mask 295 is brought into contact with the peripheral portion of the substrate 12 as shown in FIG. 15(a), and where the mask 295 and the substrate 12 are brought apart from each other as shown in FIG. 15(b), and the RA/MR ratio characteristics of the MgO layer of the magnetoresistance effect element having the MgO layer are compared (FIG. 16). In FIG. 16, solid triangles (▲) represent the characteristics when the mask 295 is brought into contact with the peripheral portion of the substrate 12, and solid circles (•) represent a characteristic in the case in which the mask 295 and the substrate 12 are brought apart from each other.

For example, a higher MR ratio is obtained in the case (•) in which the mask 295 and the substrate 12 are brought apart from each other than the case (solid triangle) in which the mask 295 and the substrate 12 are brought into contact with each other at a point where the RA is 5 $\Omega\text{-}\mu m^2$, and as a whole, the subject to achieve both low RA and high MR ratio is realized further preferably in the case (•) in which the mask 295 and the substrate 12 are brought apart from each other. Therefore, it is considered that the mask 295 and the substrate 12 are brought into the electrically insulated state by bringing the metallic mask 295 and the substrate 12 apart from each other, and the electric current is prevented from flowing to the MgO layer during the formation of the MgO film and, consequently, prevention of deterioration of the film quality of the MgO layer and deterioration of the characteristic of the magnetoresistance effect element are achieved.

In this embodiment, the mask 295 and the substrate 12 are brought into the electrically insulated state by bringing the mask 295 and the substrate 12 apart from each other. However, for example, by forming the mask 295 by itself of an insulating substance, the state in which the mask 295 and the substrate 12 are electrically insulated may be achieved even when the substrate 12 and the mask 295 are in contact with each other as shown in FIG. 15(a), so that the same effects as described above are achieved.

Although the embodiments from the first embodiment to the seventh embodiment of the present invention have been described referring to the attached drawings thus far, the present invention is not limited to the embodiments shown above, and various modifications may be made within the technical scope understood from the description in claims.

For example, although the film forming apparatus in the embodiments has been described as an apparatus having the three film forming chambers, the invention is not limited thereto. Although the apparatus of the present invention is described as an apparatus having two or three film forming means in the film forming chamber, the invention is not limited thereto. The apparatus of the present invention is not limited to the shape of the film forming chamber in the apparatus shown in the embodiments.

In the apparatus in the embodiments, the components in the film forming chamber for adhering the substance whose getter effect with respect to the oxidizing gas such as oxygen or water is large have been described as the film forming chamber inner wall, the adhesion preventing shield, the partitioning panel or the shutter, they are not limited thereto. What is important is adhesion to the surfaces of the components in the interior of the film forming chambers, and it may be other configurations.

Although the method of forming the respective layers of the magnetoresistance effect element has been described as the method on the basis of the spattering, other film forming methods such as deposition or the like are also applicable, and the film forming method is not specifically limited.

The invention claimed is:
1. A method of manufacturing a magnetoresistive device having a lower electrode, a first ferromagnetic layer arranged above the lower electrode, an MgO layer arranged above the first ferromagnetic layer, a second ferromagnetic layer arranged above the MgO layer, and an upper electrode arranged above the second ferromagnetic layer, the method comprising:
(a) providing a first film forming chamber comprising a Ta target, a MgO target, a partitioning member arranged between the Ta target and the MgO target such that a first space in which the Ta target is arranged is partitioned by the partitioning member from a second space in which the MgO target is arranged, a first shutter configured to shield the Ta target, a second shutter configured to shield the MgO target, and a substrate holder configured to hold a substrate;
(b) performing a pre-sputtering in the film forming chamber for pre-sputtering the Ta target in a state that the first and second shutters are closed;
(c) forming the lower electrode above the substrate placed on the substrate holder, in the first film forming chamber, by sputtering the Ta target, wherein Ta is adhered to a component of the first film forming chamber so as to form a Ta film as an outermost surface on the component, during the forming of the lower electrode, the partitioning member including a portion arranged at a position directly above a center of the substrate holder;
(d) transferring the substrate having the lower electrode, from the first film forming chamber to a second film forming chamber comprising a ferromagnetic material target for forming the first ferromagnetic layer;

(e) forming the first ferromagnetic layer above the lower electrode, in the second film forming chamber, by sputtering the ferromagnetic material target;
(f) transferring the substrate having the first ferromagnetic layer to the first film forming chamber;
(g) exhausting the first film forming chamber into a vacuum state with a background pressure less than 10-7 Pa, wherein the MgO target is a sintered compact having a porous structure such that oxidizing gas is absorbed to the MgO target even at the vacuum state with the background pressure less than $10^{-7}$ Pa; and
(h) forming the MgO layer on the first ferromagnetic layer by sputtering the MgO target, in the first film forming chamber in a state that the first film forming chamber has the Ta film as the outermost surface on the component thereof, wherein the sputtering the MgO target causes the oxidizing gas which has been absorbed to the MgO target to be discharged from the MgO target into a space within the first film forming chamber, and the discharged oxidizing gas is absorbed to the Ta film as the outermost surface on the component by a getter effect provided by the Ta film, which improves quality of the MgO layer.

2. The method according to claim 1, wherein the first film forming chamber includes a substrate holder and a partitioning member between the Ta target and the MgO target, and a said lower end surface of the partitioning member is parallel to an upper face of the substrate holder.

3. The method according to claim 1, wherein the first film forming chamber includes a substrate holder and a partitioning member between the Ta target and the MgO target, and a said lower end surface of the partitioning member is arranged at a position lower than a position where an upper surface of the first shutter is arranged.

4. The method according to claim 1, wherein the first film forming chamber includes a substrate holder and a partitioning member between the Ta target and the MgO target, and a portion of the partitioning member has a lower end surface facing an upper face of the substrate holder.

5. The method according to claim 4, wherein said lower end surface is parallel to the upper face of the substrate holder.

6. The method according to claim 4, wherein said lower end surface is arranged lower than an upper surface of the first shutter is arranged.

7. The method according to claim 1, wherein the presputtering is performed while making a third shutter, which is arranged between the substrate holder and a space where the first shutter and the second shutter are arranged, at a closed state, and
wherein the forming of the lower electrode includes forming the lower electrode by sputtering the Ta target while making the third shutter at an opened state, making the third shutter at the closed state, and then turning off a high-frequency power which has been applied to the Ta target.

8. A method of manufacturing a magnetoresistive device having a first ferromagnetic layer, an MgO layer arranged above the first ferromagnetic layer, and a second ferromagnetic layer arranged above the MgO layer, the method comprising:
(a) providing a film forming chamber comprising a first target comprising Ta which is an element having a higher getter effect with respect to an oxidizing gas than MgO, and a second target comprising MgO;
(b) opening a first shutter for enclosing the first target, while closing a second shutter for enclosing the second target;
(c) performing a first sputtering process in the film forming chamber for sputtering the first target such that a first substance is adhered to an interior surface of the film forming chamber facing the interior of the film forming chamber; and
(d) performing a second process for forming the MgO layer on a substrate in the film forming chamber, after the first sputtering process, the second process for forming the MgO layer comprising opening the second shutter, carrying out a second sputtering process;
wherein the second process is a next process performed in the film forming chamber after the first sputtering process so that the first substance is the last substance formed on the interior surface of the film forming chamber.

9. A method of manufacturing a magnetoresistive device having a first ferromagnetic layer, an MgO layer arranged above the first ferromagnetic layer, and a second ferromagnetic layer arranged above the MgO layer, the method comprising:
(a) providing a film forming chamber comprising a first target comprising Ta which is an element having a higher getter effect with respect to an oxidizing gas than MgO, and a second target comprising MgO;
(b) opening a first shutter for enclosing the first target, while closing a second shutter for enclosing the second target;
(c) performing a first sputtering process in the film forming chamber for sputtering the first target such that the first substance is adhered to an interior surface of the film forming chamber facing the interior of the film forming chamber; and
(d) performing a second process for forming the MgO layer on a substrate in the film forming chamber, after the first sputtering process, the second process for forming the MgO layer comprising opening the second shutter, carrying out a second sputtering process;
wherein the first and second targets are the only targets in the film forming chamber.

10. A method of manufacturing a magnetoresistive device having an electrode layer, a first ferromagnetic layer above the electrode layer, an MgO layer arranged above the first ferromagnetic layer, and a second ferromagnetic layer arranged above the MgO layer, the method comprising:
(a) performing a first sputtering process in a first film forming chamber comprising a first target comprising Ta which is an element having a higher getter effect with respect to an oxidizing gas than MgO, and a second target comprising MgO, the first sputtering process including sputtering the first target such that the electrode layer of Ta is formed above a substrate, and Ta is adhered to an interior surface of the film forming chamber facing the interior of the film forming chamber;
(b) after the first sputtering process, performing a second sputtering process in a second film forming chamber such that the first ferromagnetic layer is formed above the electrode layer; and
(c) after the second sputtering process, performing a third sputtering process in the first film forming chamber in a state that Ta adhered to the interior surface of the first film forming chamber is exposed to the interior of the film forming chamber, the third sputtering process including sputtering the second target such that the MgO layer is formed above the first ferromagnetic layer.

\* \* \* \* \*